(12) United States Patent
Hung et al.

(10) Patent No.: US 10,910,523 B2
(45) Date of Patent: Feb. 2, 2021

(54) LIGHT EMITTING DEVICE

(71) Applicant: Genesis Photonics Inc., Tainan (TW)

(72) Inventors: Cheng-Wei Hung, Tainan (TW);
Chin-Hua Hung, Tainan (TW);
Long-Chi Du, Tainan (TW); Jui-Fu Chang, Tainan (TW); Po-Tsun Kuo, Chiayi (TW); Hao-Chung Lee, Tainan (TW); Yu-Feng Lin, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 16/004,445

(22) Filed: Jun. 11, 2018

(65) Prior Publication Data
US 2018/0294388 A1  Oct. 11, 2018

Related U.S. Application Data

(60) Division of application No. 15/268,654, filed on Sep. 19, 2016, now Pat. No. 9,997,676, which is a
(Continued)

(30) Foreign Application Priority Data

May 14, 2014 (TW) .............................. 103116987 A
Jan. 8, 2016 (TW) .............................. 105100499 A
May 5, 2016 (CN) .......................... 2016 1 0293182

(51) Int. Cl.
*H01L 33/50* (2010.01)
*H01L 33/46* (2010.01)
(Continued)

(52) U.S. Cl.
CPC ............ *H01L 33/502* (2013.01); *H01L 21/56* (2013.01); *H01L 21/561* (2013.01);
(Continued)

(58) Field of Classification Search
None
See application file for complete search history.

(56) References Cited

U.S. PATENT DOCUMENTS 6,155,699 A  12/2000 Miller et al.
7,045,828 B2  5/2006 Shimizu et al.
(Continued)

FOREIGN PATENT DOCUMENTS

CN  1674316  9/2005
CN  101515621  8/2009
(Continued)

OTHER PUBLICATIONS

"Office Action of CN Related Application, application No. 201510244596.4," dated Apr. 27, 2018, p. 1-p. 11.
(Continued)

*Primary Examiner* — Mounir S Amer
(74) *Attorney, Agent, or Firm* — JCIPRNET

(57) ABSTRACT

A light emitting device includes a wavelength conversion layer, at least one light emitting unit and a reflective protecting element. The wavelength conversion layer has an upper surface and a lower surface opposite to each other. The light emitting unit has two electrode pads located on the same side of the light emitting unit. The light emitting unit is disposed on the upper surface of the wavelength conversion layer and exposes the two electrode pads. The reflective protecting element encapsulates at least a portion of the light emitting unit and a portion of the wavelength conversion layer, and exposes the two electrode pads of the light emitting unit.

14 Claims, 25 Drawing Sheets

Related U.S. Application Data continuation-in-part of application No. 14/711,798, filed on May 14, 2015, now abandoned.

(60) Provisional application No. 62/157,450, filed on May 5, 2015, provisional application No. 62/220,249, filed on Sep. 18, 2015, provisional application No. 62/236,150, filed on Oct. 2, 2015, provisional application No. 62/245,247, filed on Oct. 22, 2015, provisional application No. 62/262,876, filed on Dec. 3, 2015.

(51) Int. Cl.
  *H01L 33/56* (2010.01)
  *H01L 33/38* (2010.01)
  *H01L 21/56* (2006.01)
  *H01L 23/00* (2006.01)
  *H01L 21/683* (2006.01)
  *H01L 25/075* (2006.01)

(52) U.S. Cl.
  CPC .......... *H01L 21/6835* (2013.01); *H01L 24/19* (2013.01); *H01L 24/20* (2013.01); *H01L 24/32* (2013.01); *H01L 24/96* (2013.01); *H01L 33/38* (2013.01); *H01L 33/46* (2013.01); *H01L 33/50* (2013.01); *H01L 33/56* (2013.01); *H01L 21/568* (2013.01); *H01L 24/83* (2013.01); *H01L 24/97* (2013.01); *H01L 25/0753* (2013.01); *H01L 33/504* (2013.01); *H01L 33/508* (2013.01); *H01L 2221/68331* (2013.01); *H01L 2224/04105* (2013.01); *H01L 2224/18* (2013.01); *H01L 2224/19* (2013.01); *H01L 2224/32105* (2013.01); *H01L 2224/32106* (2013.01); *H01L 2224/32225* (2013.01); *H01L 2224/73267* (2013.01); *H01L 2224/8392* (2013.01); *H01L 2224/9222* (2013.01); *H01L 2224/96* (2013.01); *H01L 2224/97* (2013.01); *H01L 2924/12041* (2013.01); *H01L 2924/18162* (2013.01); *H01L 2933/005* (2013.01); *H01L 2933/0016* (2013.01); *H01L 2933/0025* (2013.01); *H01L 2933/0041* (2013.01)

(56) References Cited

U.S. PATENT DOCUMENTS

| | | | |
|---|---|---|---|
| 8,350,283 B2 | 1/2013 | Nishiuchi et al. | |
| 8,482,016 B2 | 7/2013 | Harada | |
| 8,860,061 B2 | 10/2014 | Kotani | |
| 9,029,893 B2 | 5/2015 | Akimoto et al. | |
| 9,419,189 B1 | 8/2016 | David et al. | |
| 9,490,398 B2 | 11/2016 | Oyamada et al. | |
| 9,887,329 B2 | 2/2018 | Yamada | |
| 9,922,963 B2 | 3/2018 | Hung et al. | |
| 2003/0006509 A1 | 1/2003 | Suzuki et al. | |
| 2003/0067070 A1 | 4/2003 | Kwon et al. | |
| 2004/0119402 A1 | 6/2004 | Shiang et al. | |
| 2004/0239242 A1 | 12/2004 | Mano et al. | |
| 2005/0045897 A1 | 3/2005 | Chou et al. | |
| 2006/0055309 A1 | 3/2006 | Ono et al. | |
| 2006/0169994 A1 | 8/2006 | Tu et al. | |
| 2007/0114552 A1 | 5/2007 | Jang et al. | |
| 2008/0150119 A1 | 6/2008 | Jang et al. | |
| 2009/0242917 A1 | 10/2009 | Inoue et al. | |
| 2009/0296389 A1 | 12/2009 | Hsu | |
| 2010/0066236 A1 | 3/2010 | Xu et al. | |
| 2010/0117530 A1 | 5/2010 | Lin et al. | |
| 2010/0258419 A1 | 10/2010 | Chung et al. | |
| 2010/0258830 A1 | 10/2010 | Ide et al. | |
| 2011/0001157 A1 | 1/2011 | McKenzie et al. | |
| 2011/0018017 A1 | 1/2011 | Bierhuizen et al. | |
| 2011/0079805 A1 | 4/2011 | Yu et al. | |
| 2011/0102883 A1 | 5/2011 | Narendran et al. | |
| 2011/0297980 A1 | 12/2011 | Sugizaki et al. | |
| 2012/0025218 A1 | 2/2012 | Ito et al. | |
| 2012/0223351 A1 | 9/2012 | Margalit | |
| 2012/0235126 A1 | 9/2012 | Yamazaki et al. | |
| 2012/0236582 A1 | 9/2012 | Waragaya et al. | |
| 2012/0261700 A1 | 10/2012 | Ooyabu et al. | |
| 2012/0305942 A1* | 12/2012 | Lo .................. H01L 33/007 257/77 |
| 2013/0093313 A1 | 4/2013 | Oyamada | |
| 2013/0105978 A1 | 5/2013 | Hung | |
| 2013/0121000 A1 | 5/2013 | Lee et al. | |
| 2013/0194794 A1 | 8/2013 | Kim | |
| 2013/0207141 A1 | 8/2013 | Reiherzer | |
| 2013/0207142 A1 | 8/2013 | Reiherzer | |
| 2013/0256711 A1 | 10/2013 | Joo et al. | |
| 2013/0277093 A1 | 10/2013 | Sun et al. | |
| 2013/0285091 A1 | 10/2013 | Akimoto et al. | |
| 2014/0009060 A1 | 1/2014 | Kimura et al. | |
| 2014/0021493 A1 | 1/2014 | Andrews et al. | |
| 2014/0054621 A1 | 2/2014 | Seko | |
| 2014/0124812 A1 | 5/2014 | Kuramoto et al. | |
| 2014/0131753 A1 | 5/2014 | Ishida et al. | |
| 2014/0138725 A1 | 5/2014 | Oyamada | |
| 2014/0252389 A1* | 9/2014 | Koizumi ............ H01L 33/005 257/98 |
| 2015/0014720 A1 | 1/2015 | Tien | |
| 2015/0102373 A1* | 4/2015 | Lee .................. H01L 33/50 257/98 |
| 2015/0102377 A1 | 4/2015 | Huang et al. | |
| 2015/0115300 A1* | 4/2015 | Tomizawa ............ H01L 33/38 257/98 |
| 2015/0179901 A1 | 6/2015 | Ok et al. | |
| 2015/0188004 A1 | 7/2015 | Ozeki et al. | |
| 2015/0263242 A1 | 9/2015 | Tomizawa et al. | |
| 2015/0311405 A1 | 10/2015 | Oyamada et al. | |
| 2016/0079496 A1 | 3/2016 | Huang et al. | |
| 2016/0155900 A1 | 6/2016 | Bono et al. | |
| 2016/0155915 A1 | 6/2016 | Ling et al. | |
| 2016/0181476 A1 | 6/2016 | Chang et al. | |
| 2016/0190406 A1 | 6/2016 | Liu et al. | |
| 2016/0035952 A1 | 10/2016 | Yamada et al. | |

FOREIGN PATENT DOCUMENTS

| | | |
|---|---|---|
| CN | 101855735 | 10/2010 |
| CN | 101867003 | 10/2010 |
| CN | 101878540 | 11/2010 |
| CN | 101978516 | 2/2011 |
| CN | 102132428 | 7/2011 |
| CN | 201910421 | 7/2011 |
| CN | 102222757 | 10/2011 |
| CN | 102263194 | 11/2011 |
| CN | 102290500 | 12/2011 |
| CN | 102315354 | 1/2012 |
| CN | 102347423 | 2/2012 |
| CN | 102637809 | 8/2012 |
| CN | 102738368 | 10/2012 |
| CN | 103022010 | 4/2013 |
| CN | 103050601 | 4/2013 |
| CN | 103137571 | 6/2013 |
| CN | 103187515 | 7/2013 |
| CN | 103199183 | 7/2013 |
| CN | 103531725 | 1/2014 |
| CN | 103534822 | 1/2014 |
| CN | 203774363 | 8/2014 |
| CN | 203910851 | 10/2014 |
| CN | 104253194 | 12/2014 |
| CN | 104347610 | 2/2015 |
| CN | 104521015 | 4/2015 |
| JP | 2012227470 | 11/2012 |
| TW | 201103173 | 1/2011 |
| TW | 201114072 | 4/2011 |
| TW | M453969 | 5/2013 |
| TW | 201401565 | 1/2014 |
| TW | 201403873 | 1/2014 |

(56) References Cited

FOREIGN PATENT DOCUMENTS

| TW | 201515273 | 4/2015 |
|---|---|---|
| TW | 201541674 | 11/2015 |
| WO | 2011093454 | 8/2011 |

OTHER PUBLICATIONS

"Office Action of U.S. Related Application, U.S. Appl. No. 15/657,299," dated May 16, 2018, p. 1-p. 37.
"Office Action of CN Related Application, application No. 201410362787.6," dated Apr. 20, 2018, p. 1-p. 9.
"Office Action of U.S. Related Application, U.S. Appl. No. 15/959,534," dated Jun. 21, 2018, p. 1-p. 30.
"Office Action of Taiwan Related Application No. 107117295", dated Jun. 11, 2019, pp. 1-5.
"Office Action of Taiwan Related Application No. 105108594", dated Jun. 18, 2019, pp. 1-4.
"Notice of Allowance of U.S. Appl. No. 15/823,480", dated Apr. 12, 2019, pp. 1-26.
Office Action of Taiwan Related Application, application No. 105104666, dated Jun. 28, 2018, p. 1-p. 6.
"Office Action of China Related Application No. 201610830051.6", dated Mar. 21, 2019, pp. 1-9.
"Office Action of China Related Application No. 201610089097.7", dated Dec. 4, 2018, pp. 1-8.
"Office Action of China Related Application No. 201610157182.2", dated Dec. 3, 2018, pp. 1-11.
"Final Office Action of U.S. related Application, U.S. Appl. No. 15/657,299," dated Oct. 2, 2018, pp. 1-20.
"Office Action of U.S. related Application, U.S. Appl. No. 15/787,811," dated Oct. 18, 2018, pp. 1-49.
"Office Action of U.S. related Application, U.S. Appl. No. 15/881,802," dated Aug. 10, 2018, pp. 1-23.
"Office Action of Taiwan related Application, serial No. 104131083," dated Oct. 5, 2018, pp. 1-8.
"Office Action of U.S. Appl. No. 15/924,461", dated Feb. 15, 2019, pp. 1-47.
"Office Action of China Related Application No. 201610293182.5", dated Jan. 22, 2019, pp. 1-6.
"Office Action of U.S. Appl. No. 15/823,480", dated Dec. 31, 2018, pp. 1-35.
"Office Action of Taiwan Related Application No. 107119063", dated Dec. 6, 2018, pp. 1-3.
"Office Action of U.S. Appl. No. 15/973,552", dated Nov. 29, 2018, pp. 1-22.
"Office Action of China Related Application No. 201610157140.9", dated Nov. 1, 2018, pp. 1-6.
"Office Action of China Related Application No. 201610156914.6", dated Nov. 2, 2018, pp. 1-9.
"Office Action of U.S. Appl. No. 15/908,779", dated Oct. 30, 2018, pp. 1-28.
"Office Action of China Related Application, application No. 201610830051.6", dated Sep. 27, 2019, p. 1-p. 6.
"Office Action of United States Related Application, U.S. Appl. No. 16/595,414", dated Dec. 11, 2019, p. 1-p. 9.
"Office Action of Taiwan Counterpart Application", dated Nov. 7, 2019, p. 1-p. 5.
Office Action of Taiwan Related Application No. 108118972, dated Dec. 25, 2019, pp. 1-9.
"Office Action of China Related Application, application No. 201910110303.1", dated Dec. 25, 2019, p. 1-p. 11.
"Office Action of Taiwan Related Application No. 105107287", dated Jan. 17, 2020, pp. 1-7.
"Office Action of U.S. Related Application, U.S. Appl. No. 16/180,071", dated Jan. 8, 2020, p. 1-p. 28.
"Office Action of Taiwan Counterpart Application", dated Apr. 20, 2020, p. 1-p. 7.
"Office Action of U.S. Related Application, U.S. Appl. No. 16/699,805", dated May 12, 2020, p. 1-p. 71.
"Office Action of China Related Application, application No. 201510244596.4", dated Jun. 2, 2020, pp. 1-6.

* cited by examiner

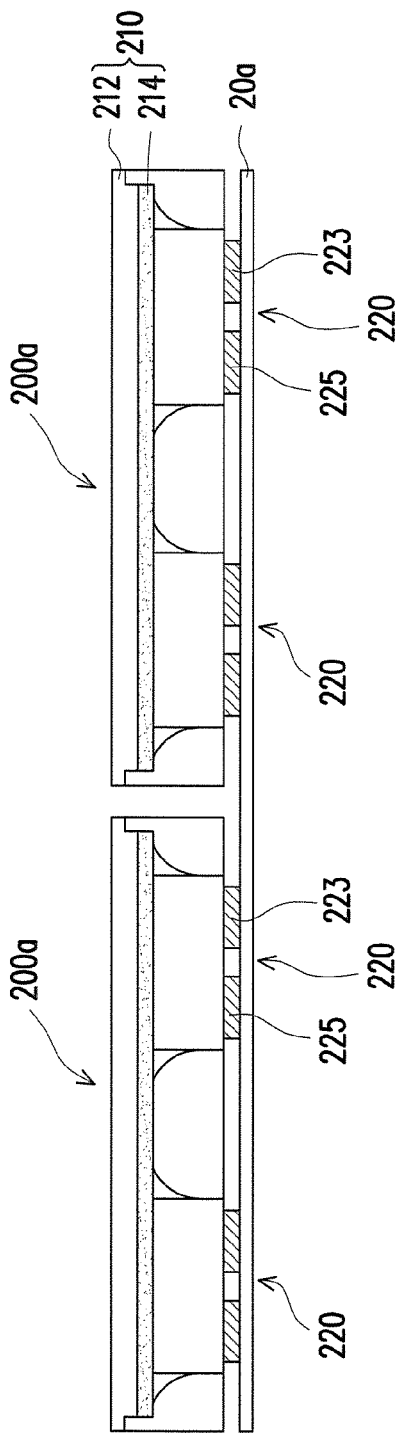
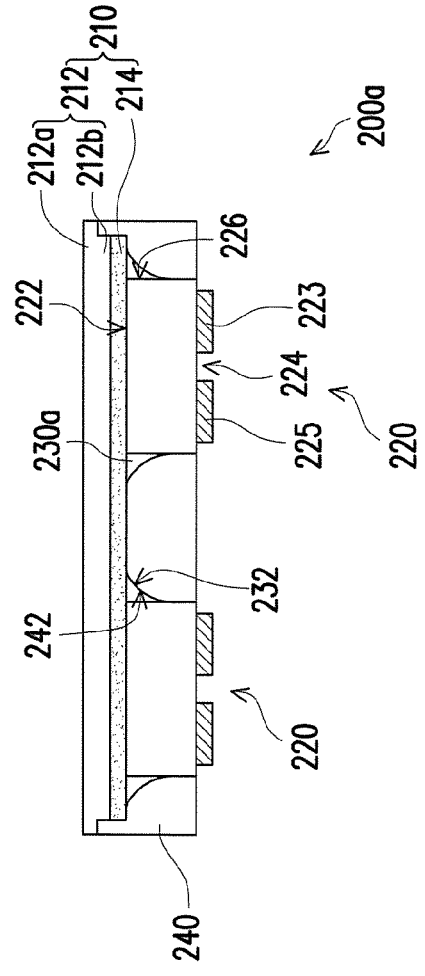
FIG. 17D
FIG. 17E

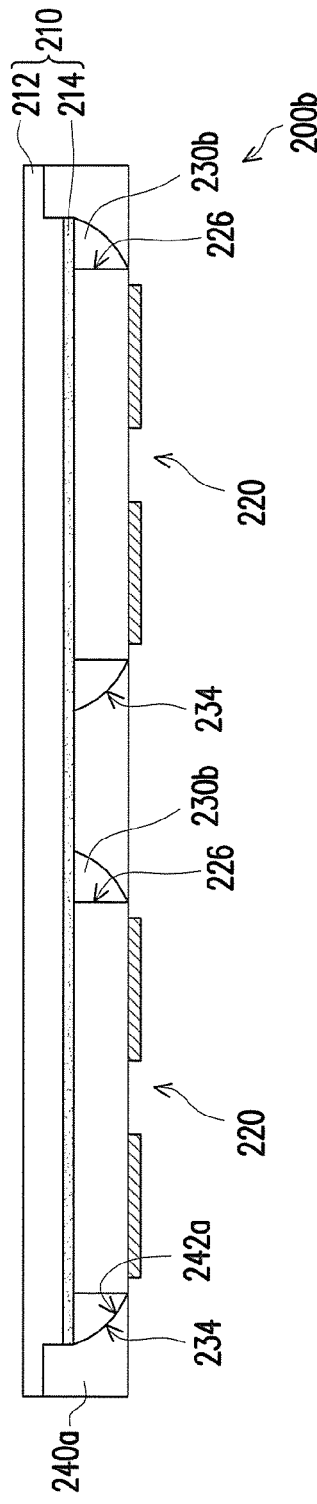
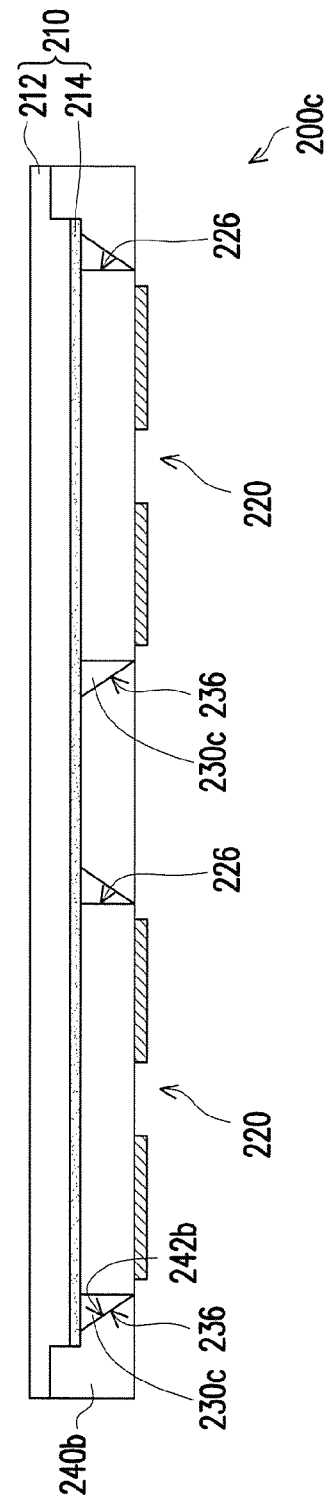

LIGHT EMITTING DEVICE

CROSS-REFERENCE TO RELATED APPLICATION

This is a divisional application of and claims the priority benefit of U.S. patent application Ser. No. 15/268,654, filed on Sep. 19, 2016, now allowed. The prior U.S. patent application Ser. No. 15/268,654 is a continuation-in-part application of and claims the priority benefit of U.S. application Ser. No. 14/711,798, filed on May 14, 2015, now abandoned, which claims the priority benefits of Taiwan application serial no. 103116987, filed on May 14, 2014 and U.S. provisional application Ser. No. 62/157,450, filed on May 5, 2015. The prior U.S. patent application Ser. No. 15/268,654 also claims the priority benefits of U.S. provisional application Ser. No. 62/220,249, filed on Sep. 18, 2015, U.S. provisional application Ser. No. 62/236,150, filed on Oct. 2, 2015, Taiwan application serial no. 105100499, filed on Jan. 8, 2016, U.S. provisional application Ser. No. 62/245,247, filed on Oct. 22, 2015, U.S. provisional application Ser. No. 62/262,876, filed on Dec. 3, 2015 and China application serial no. 201610293182.5, filed on May 5, 2016. The entirety of each of the above-mentioned patent applications is hereby incorporated by reference herein and made a part of this specification.

BACKGROUND OF THE INVENTION

1. Field of the Invention

The invention relates to a light emitting device, and relates particularly to a light emitting device utilizing a light emitting diode as a light source.

2. Description of Related Art

Generally speaking, in a light emitting diode (LED) package structure typically a light emitting diode (LED) chip is disposed on a carrying base formed in a concave cup shape from ceramic material or metal material, to fix and support the LED diode chip. Then, encapsulation adhesive is used to encapsulate the LED chip, and complete the manufacturing of the LED package structure. Here, an electrode of the LED chip is located above the carrying base and located in the concave cup. However, the carrying base of the concave cup shape has a particular thickness, such that a thickness of the LED package structure may not be reduced efficiently, therefore causing the LED package structure to be unable to meet modern needs of miniaturization.

SUMMARY OF THE INVENTION

The invention provides a light emitting device, which does not require a conventional carrying support, and may have a thinner package thickness and meet miniaturization requirements.

The invention provides a manufacturing method for manufacturing the abovementioned light emitting device.

A light emitting device of the invention includes a wavelength conversion layer, at least one light emitting unit and a reflective protecting element. The wavelength conversion layer has an upper surface and a lower surface opposite to each other. The light emitting unit has two electrode pads located on the same side of the light emitting unit. The light emitting unit is disposed on the upper surface of the wavelength conversion layer and exposes the two electrode pads. The reflective protecting element encapsulates at least a portion of the light emitting unit and a portion of the wavelength conversion layer, and exposes the two electrode pads of the light emitting unit.

In one embodiment of the present invention, the abovementioned light emitting device further includes an adhesive layer disposed on the wavelength conversion layer and located between the light emitting unit and the reflective protecting element.

In one embodiment of the present invention, the abovementioned adhesive layer is further disposed between the wavelength conversion layer and the light emitting unit.

In one embodiment of the present invention, the abovementioned reflective protecting element further includes a reflective surface in contact with the light emitting unit.

In one embodiment of the present invention, the abovementioned reflective surface of the reflective protecting element is a flat surface or a curved surface.

In one embodiment of the present invention, the abovementioned reflective protecting element further completely encapsulates a side surface of the wavelength conversion layer.

In one embodiment of the present invention, a bottom surface of the abovementioned reflective protecting element and the lower surface of the wavelength conversion layer form a plane.

In one embodiment of the present invention, the abovementioned reflective protecting element further at least encapsulates a portion of a side surface of the wavelength conversion layer.

In one embodiment of the present invention, the abovementioned side surface of a portion of the wavelength conversion layer which is not encapsulated by the reflective protecting element and a side surface of the reflective protecting element form a side plane of the light emitting device.

In one embodiment of the present invention, the abovementioned wavelength conversion layer further includes a first exposed side portion and a second exposed side portion which are not encapsulated by the reflective protecting element. The first exposed side portion is not parallel to the second exposed side portion, and a thickness of the wavelength conversion layer at the first exposed side portion is different from a thickness of the wavelength conversion layer at the second exposed side portion.

In one embodiment of the present invention, the abovementioned wavelength conversion layer further includes a low concentration fluorescent layer and a high concentration fluorescent layer, the high concentration fluorescent layer is between the low concentration fluorescent layer and the light emitting unit.

In one embodiment of the present invention, the abovementioned reflective protecting element fills in a gap between the two electrode pads.

In one embodiment of the present invention, the abovementioned reflective protecting element completely fills the gap between the two electrode pads, and a surface of the reflective protecting element is aligned with a surface of the two electrode pads.

In one embodiment of the present invention, the abovementioned at least one light emitting unit is a plurality of light emitting units, the wavelength conversion layer has at least one trench located between two of the light emitting units.

The manufacturing method of a light emitting device of the invention includes the following steps. providing a wavelength conversion layer; disposing a plurality of light emitting units arranged at intervals on the wavelength conversion layer, and exposing two electrode pads of each light emitting unit; forming a plurality of trenches on the wavelength conversion layer, wherein the trenches are located between the light emitting units; forming a reflective protecting element on the wavelength conversion layer and between the light emitting units, and filling the reflective protecting element in the trenches, wherein the reflective protecting element exposes the electrode pads of the light emitting units; and performing a cutting process along the trenches to form a plurality of light emitting devices.

In one embodiment of the present invention, a depth of each abovementioned trench is at least a half of a thickness of the wavelength conversion layer.

In one embodiment of the present invention, the abovementioned manufacturing method of the light emitting device further includes: forming an adhesive layer on the wavelength conversion layer after disposing the light emitting units arranged at intervals on the wavelength conversion layer.

In one embodiment of the present invention, the abovementioned manufacturing method of the light emitting device further includes: forming an adhesive layer on the wavelength conversion layer before disposing the light emitting units arranged at intervals on the wavelength conversion layer.

In one embodiment of the present invention, the abovementioned reflective protecting element further includes a reflective surface in contact with the light emitting unit.

In one embodiment of the present invention, the abovementioned reflective surface of the reflective protecting element is a flat surface or a curved surface.

In one embodiment of the present invention, the abovementioned wavelength conversion layer further includes a low concentration fluorescent layer and a high concentration fluorescent layer, the light emitting unit is disposed on the high concentration fluorescent layer.

Based on the above, because the reflective protecting element of the invention encapsulates a side surface of the light emitting device, and a bottom surface of the reflective protecting element is aligned with a first bottom surface of the first electrode pad and a second bottom surface of the second electrode pad of the light emitting unit, therefore the light emitting device of the invention does not require a conventional carrying support to support and fix the light emitting unit, and may effectively lower the thickness and manufacturing cost of the package. At the same time, the forward light emitting efficiency of the light emitting unit can also be effectively increased.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 17A to FIG. 17E are schematic cross-sectional views illustrating a manufacturing method of a light emitting device according to another embodiment of the invention.

FIG. 18A to FIG. 18B are schematic cross-sectional views illustrating two light emitting devices according to two embodiments of the invention.

DESCRIPTION OF THE EMBODIMENTS

Figure 1:
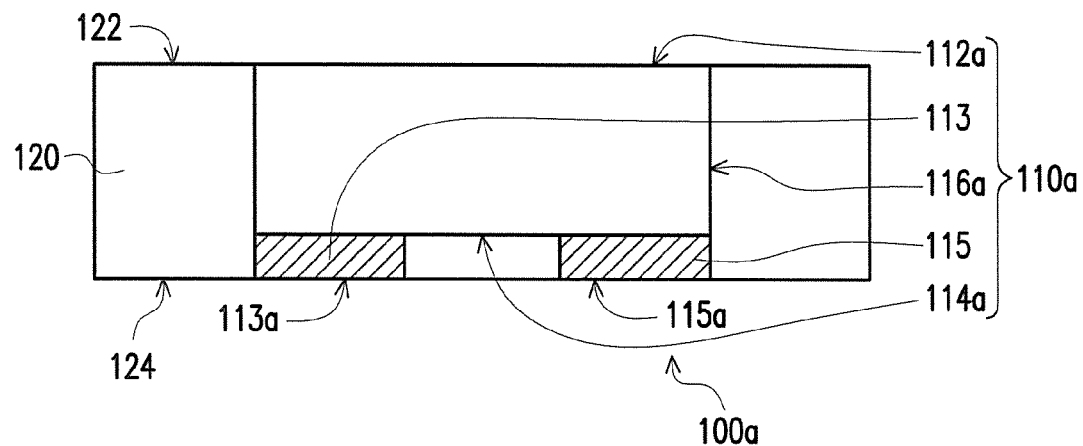
FIG. 1 is a schematic diagram illustrating a light emitting device according to an embodiment of the invention.

FIG. 1 is a schematic diagram illustrating a light emitting device according to an embodiment of the invention. Referring to FIG. 1, in the present embodiment, a light emitting device 100*a* includes a light emitting unit 110*a* and a protecting element 120. The light emitting unit 110*a* has an upper surface 112a and a lower surface 114a opposite to each other, a side surface 116a connecting the upper surface 112a and the lower surface 114a and a first electrode pad 113 and a second electrode pad 115 located on the lower surface 114a and separated from each other. The protecting element 120 encapsulates the side surface 116a of the light emitting unit 110a and exposes the upper surface 112a, a first bottom surface 113a of the first electrode pad 113 and a second bottom surface 115a of the second electrode pad 115.

More specifically, as shown in FIG. 1, the upper surface 112a of the light emitting unit 110a of the present embodiment is aligned with a top surface 122 of the protecting element 120, a bottom surface 124 of the protecting element 120 is aligned with the first bottom surface 113a of the first electrode pad 113 and the second bottom surface 115a of the second electrode 115, and the protecting element 120 also can encapsulate or expose the lower surface 114a of the light emitting unit 110a located between the first electrode pad 113 and the second electrode pad 115. In the present embodiment, the side surface 116a of the light emitting unit 110a is perpendicular to the upper surface 112a and the lower surface 114a, however the invention is not limited thereto, and the light emitting unit 110a, for example, is an LED with a light emitting wavelength (including but not limited thereto) in a range of 315 nanometers to 780 nanometers, and the LED includes but not limited thereto an ultraviolet light LED, a blue light LED, a green light LED, a yellow light LED, an orange light LED or a red light LED.

Preferably, the reflection rate of the protecting element 120 is at least greater than 90%, that is to say, the protecting element 120 of the present embodiment has high reflectivity characteristic, wherein a material of the protecting element 120 is a polymer material doped with high reflective particles, the reflective particle, for example but not limited thereto, titanium dioxide ($TiO_2$), and the polymer material, for example but not limited thereto, epoxy or silicone. In addition, a material of the first electrode pad 113 and the second electrode pad 115 of the light emitting unit 110a of the present embodiment is a metal material or a metal alloy, for example, gold, aluminium, tin, silver, bismuth, indium or a combination thereof, however the invention is not limited thereto.

Because the protecting element 120 of the present embodiment encapsulates the side surface 116a of the light emitting unit 110a, and exposes the first bottom surface 113a of the first electrode pad 113 and the second bottom surface 115a of the second electrode pad 115 of the light emitting unit 110a, therefore the light emitting device 100a of the present embodiment not only does not require a conventional carrying support to support and fix the light emitting unit 110a, may effectively lower the thickness and manufacturing cost of the package. At the same time, the forward light emitting efficiency of the light emitting unit 110a can also be effectively increased by the reflective protecting element 120 having high reflectivity.

It should be noted here, the below embodiments utilize the same label and partial contents of the above embodiment, wherein the same labels are adopted to represent same or similar elements and the description of similar technical content is omitted.

Figure 2:
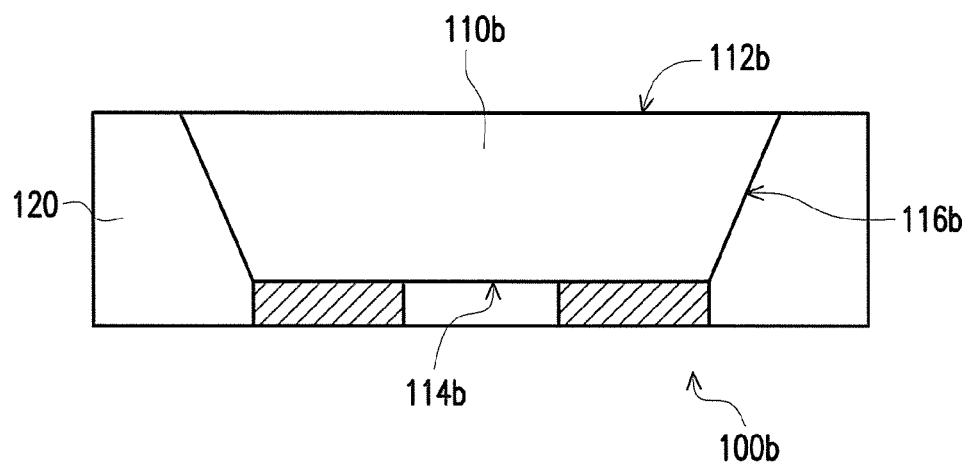
FIG. 2 is a schematic diagram illustrating a light emitting device according to another embodiment of the invention.

FIG. 2 is a schematic diagram illustrating a light emitting device according to another embodiment of the invention. Referring to FIG. 1 and FIG. 2, a light emitting device 100b of the present embodiment and the light emitting device 100a of FIG. 1 are similar. The main difference between the two lies in: a side surface 116b of the light emitting device 110b of the present embodiment is not perpendicular to an upper surface 112b and a lower surface 114b, a surface area of the upper surface 112b of the light emitting device 110b is larger than a surface area of the lower surface 114b. An angle of incidence of the side surface 116b and the lower surface 114b is, for example, between 95 degrees to 150 degree. A contour shape defined by the upper surface 112b, the side surface 116b and the lower surface 114b of the light emitting device 110b of the present embodiment renders a trapezoid, therefore the edge light emitted from the light emitting device 110b occurring may be lowered and the protecting element 120 of high reflectivity may further increase the forward light emitting efficiency of the light emitting device 110b effectively.

Figure 3:
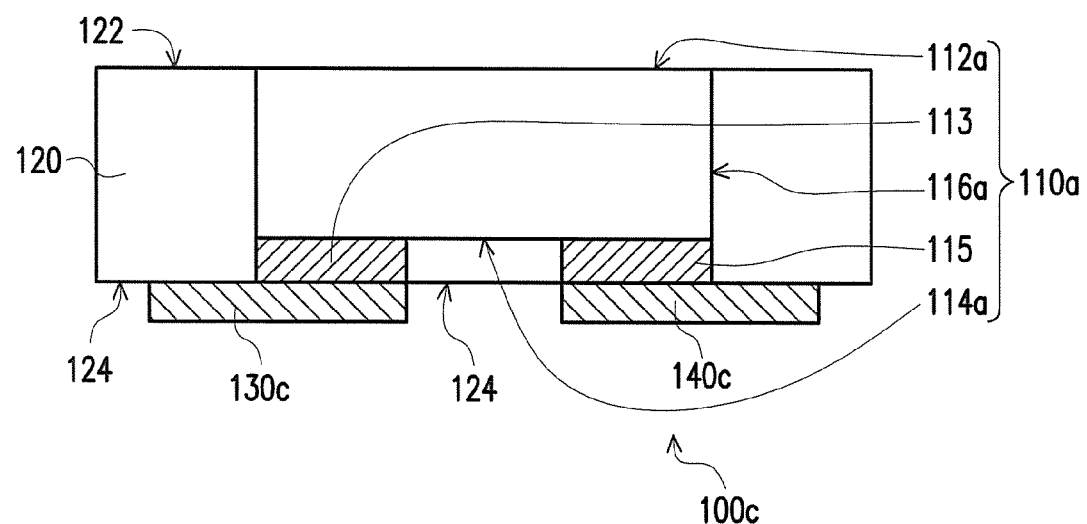
FIG. 3 is a schematic diagram illustrating a light emitting device according to another embodiment of the invention.

FIG. 3 is a schematic diagram illustrating a light emitting device according to another embodiment of the invention. Referring to FIG. 1 and FIG. 3, a light emitting device 100c of the present embodiment and the light emitting device 100a of FIG. 1 are similar. The main difference between the two lies in: the light emitting device 100c of the present embodiment further includes a first extension electrode 130c and a second extension electrode 140c. The first extension electrode 130c is disposed on the bottom surface 124 of the protecting element 120 and electrically connected to the first electrode pad 113. The second extension electrode 140c is disposed on the bottom surface 124 of the protecting element 120 and directly electrically connected to the second electrode pad 115. The first extension electrode 130c and the second extension electrode 140c are separated from each other and cover a part of the bottom surface 124 of the protecting element 120.

As shown in FIG. 3, a design of the first extension electrode 130c and the second extension electrode 140c of the present embodiment completely overlaps the first electrode pad 113 and the second electrode pad 115, and extends towards an edge of the protecting element 120. Of course, in other embodiments not shown, a design of the first extension electrode and the second extension electrode may also partially overlap the first electrode pad and the second electrode pad, and only a design in which the first extension electrode and the second extension electrode are connected electrically to the first electrode pad and the second electrode pad is the scope namely desired to be protected by the present embodiment. In addition, the first extension electrode 130c and the second extension electrode 140c of the present embodiment are exposed from a part of the bottom surface 124 of the protecting element 120.

In the present embodiment, a material of the first extension electrode 130c and the second extension electrode 140c may be respectively the same or different with the first pad electrode 113 and the second electrode pad 115 of the light emitting unit 110a. When the material of the first extension electrode 130c and the second extension electrode 140c are respectively the same as the first electrode pad 113 and the second electrode pad 115 of the light emitting unit 110a, a seamless connection may be made between the first extension electrode 130c and the first electrode pad 113, namely an integrally formed structure, and a seamless connection may be made between the second extension electrode 140c and the second electrode pad 115, namely an integrally formed structure. When the material of the first extension electrode 130c and the second extension electrode 140c are respectively different than the first electrode pad 113 and the second electrode pad 115 of the light emitting unit 110a, the material of the first extension electrode 130c and the second extension electrode 140c may, for example, be silver, gold, bismuth, tin, indium or an alloy thereof of the above materials.

Because the light emitting device 100c of the present embodiment has the first extension electrode 130c and the second extension electrode 140c respectively connected electrically with the first pad electrode 113 and the second electrode pad 115 of the light emitting unit 110a, therefore an electrode contact area of the light emitting device 100c may be effectively increased, to facilitate performing the subsequent assembly of the light emitting device 100c with other outside circuits, and may increase the alignment accuracy and the assembly efficiency. For example, an area of the first extension electrode 130c is larger than an area of the first electrode pad 113 and an area of the second extension electrode 140c is larger than an area of the second electrode pad 115.

Figure 4:
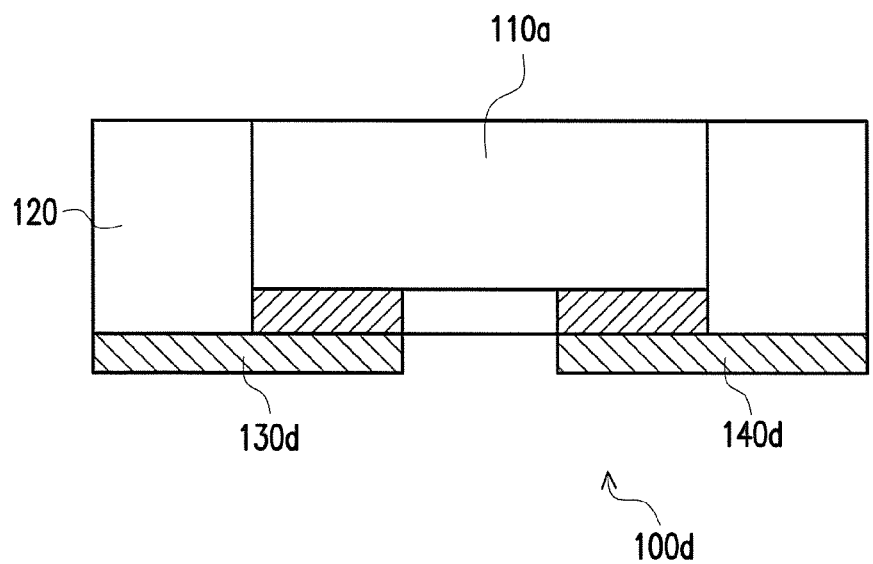
FIG. 4 is a schematic diagram illustrating a light emitting device according to another embodiment of the invention.

FIG. 4 is a schematic diagram illustrating a light emitting device according to another embodiment of the invention. Referring to FIG. 3 and FIG. 4, a light emitting device 100d of the present embodiment and the light emitting device 100c of FIG. 3 are similar. The main difference between the two lies in: an edge of a first extension electrode 130d and an edge of the second extension electrode 140d of the present embodiment are aligned with the edge of the reflective protecting element 120.

Figure 5:
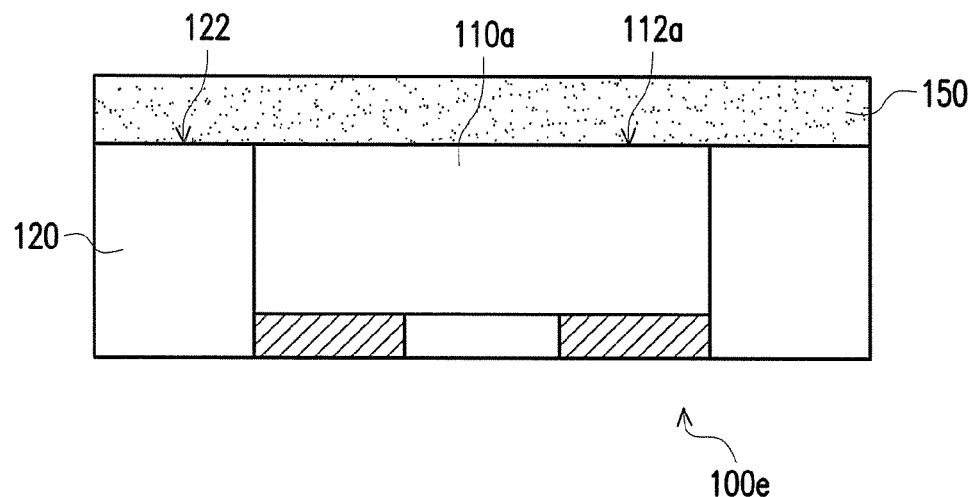
FIG. 5 is a schematic diagram illustrating a light emitting device according to another embodiment of the invention.

FIG. 5 is a schematic diagram illustrating a light emitting device according to another embodiment of the invention. Referring to FIG. 1 and FIG. 5, a light emitting device 100e of the present embodiment and the light emitting device 100a of FIG. 1 are similar. The main difference between the two lies in: the light emitting device 100e of the present embodiment further includes an encapsulation adhesive layer 150, wherein the encapsulation adhesive layer 150 is disposed on the upper surface 112a of the light emitting unit 110a, to increase light extraction efficiency and improve the light pattern. The encapsulation adhesive layer 150 may also extend onto at least portion of the upper surface 122 of the reflective protecting element 120, such that an edge of the encapsulation adhesive layer 150 can be aligned with the edge of the protecting element 120. In addition, at least one wavelength converting material may be doped in the encapsulation adhesive layer 150, wherein the wavelength converting material is used to convert the wavelengths of at least part of the light beam emitted by the light emitting unit 110a into other wavelengths of light beam, and a material of the wavelength converting material includes fluorescent material, phosphorescent material, dyes, quantum dot material or a combination thereof. In addition, an oxide having high scattering ability, such as titanium dioxide ($TiO_2$) or silicon dioxide ($SiO_2$) may be doped in the encapsulation adhesive layer 150 to increase the light emitting efficiency.

In one present embodiment of the invention, the light emitting device includes but not limited thereto a ultraviolet light emitting device, a blue light emitting device, a green light emitting device a yellow light emitting device, an orange light emitting device or a red light emitting device, and the wavelength converting material includes but not limited thereto a red wavelength converting material, an orange wavelength converting material, an orange-yellow wavelength converting material, a yellow wavelength converting material, a yellow-green wavelength converting material, a green wavelength converting material or a combination thereof, and is used to convert the wavelengths of part or all of the light beam emitted by the light emitting device. Wavelength converted light and unconverted light wavelength light after mixing, the light emitting device emits a light with a dominant wavelength at a specific wavelength range, its light color such as, but not limited to red, orange, orange-yellow, amber, yellow, yellow-green or green, or a white light with a specific correlated color temperature, the correlated color temperature range, for example, between 2500K to 7000K, but not limited thereto.

Figure 6:
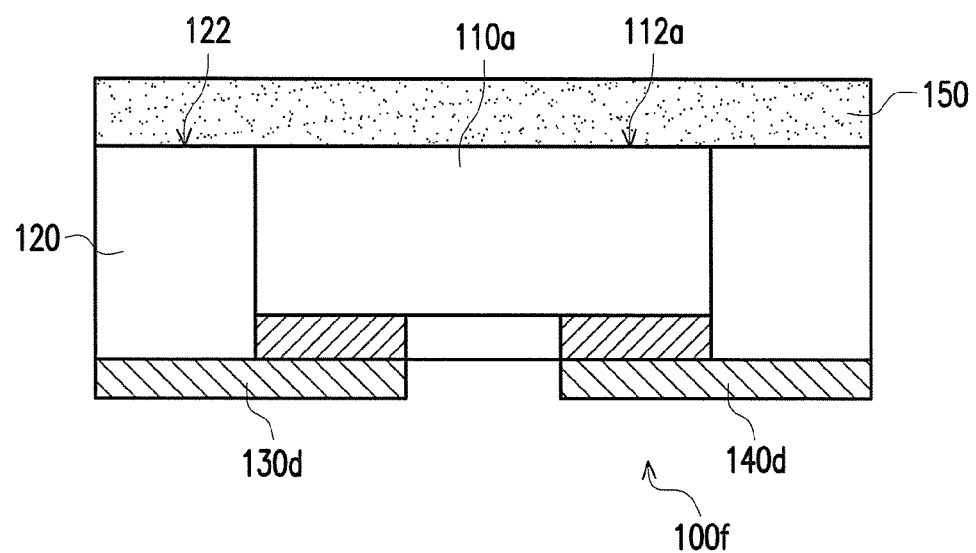
FIG. 6 is a schematic diagram illustrating a light emitting device according to another embodiment of the invention.

FIG. 6 is a schematic diagram illustrating a light emitting device according to another embodiment of the invention. Referring to FIG. 6 and FIG. 4, a light emitting device 100f of the present embodiment and the light emitting device 100d of FIG. 4 are similar. The main difference between the two lies in: the light emitting device 100f of the present embodiment further includes the encapsulation adhesive layer 150, wherein the encapsulation adhesive layer 150 is disposed on the upper surface 112a of the light emitting unit 110a, to increase light extraction efficiency and improve the light pattern. The encapsulation adhesive layer 150 may also extend onto at least portion of the upper surface 122 of the protecting element 120, and the edge of the encapsulation adhesive layer 150 can be aligned with the edge of the reflective protecting element 120. In addition, at least one wavelength converting material may be doped in the encapsulation adhesive layer 150, wherein the wavelength converting material is used to convert the wavelengths of at least part of the light beam emitted by the light emitting unit 110a into other wavelengths of light beam, and a material of the wavelength converting material includes fluorescent material, phosphorescent material, dyes, quantum dot material or a combination thereof. In addition, an oxide having high scattering ability, such as titanium dioxide ($TiO_2$) or silicon dioxide ($SiO_2$) may be doped in the encapsulation adhesive layer 150 to increase the light emitting efficiency.

It should be noted, in the embodiments of FIG. 4 and FIG. 6, the edge of the first extension electrode 130d and the edge of the second extension electrode 140d are aligned with the edge of the reflective protecting element 120. This type of design not only may expand a contact area of the electrode, but in the manufacturing process, the reflective protecting element 120 may encapsulate a plurality of light emitting devices 110a arranged at intervals at the same time, and after forming a patterned metal layer so as to respectively form the first extension electrode 130d and the second extension electrode 140d at the same time, then cutting is performed such that the edge of the first extension electrode 130d and the edge of the second extension electrode 140d of each light emitting device 100f are aligned with the edge of the reflective protecting element 120. In this way, manufacturing time may be saved.

Figure 7:
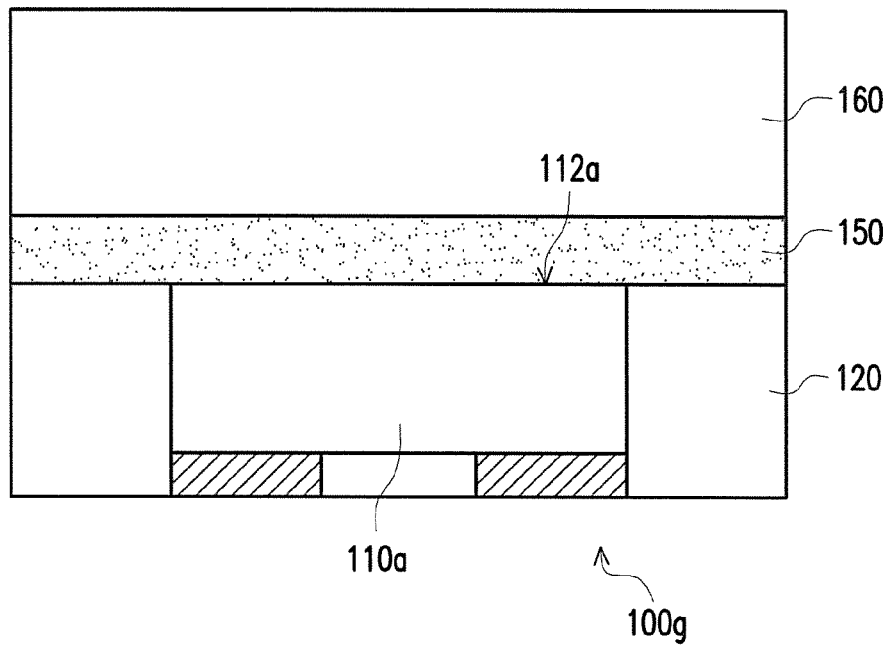
FIG. 7 is a schematic diagram illustrating a light emitting device according to another embodiment of the invention.

FIG. 7 is a schematic diagram illustrating a light emitting device according to another embodiment of the invention. With reference to FIG. 7 and FIG. 5, a light emitting device 100g of the present embodiment is similar to the light emitting device 100e of FIG. 5, and a main difference is that: the light emitting device 100g of the present embodiment further includes a light transmissible layer 160 disposed on the encapsulation adhesive layer 150, wherein a transmittance of the light transmissible layer 160, for example, is greater than 50%. In the present embodiment, a material of the light transmissible layer 160 is glass, ceramics, resins, acrylic, silicone or etc., for example, for guiding the light generated by the light emitting unit 110a to the outside to effectively increase a light flux and a light extraction rate of the light emitting device 100g and for effectively protecting the light emitting unit 110a from influence of external moisture and oxygen.

Figure 8:
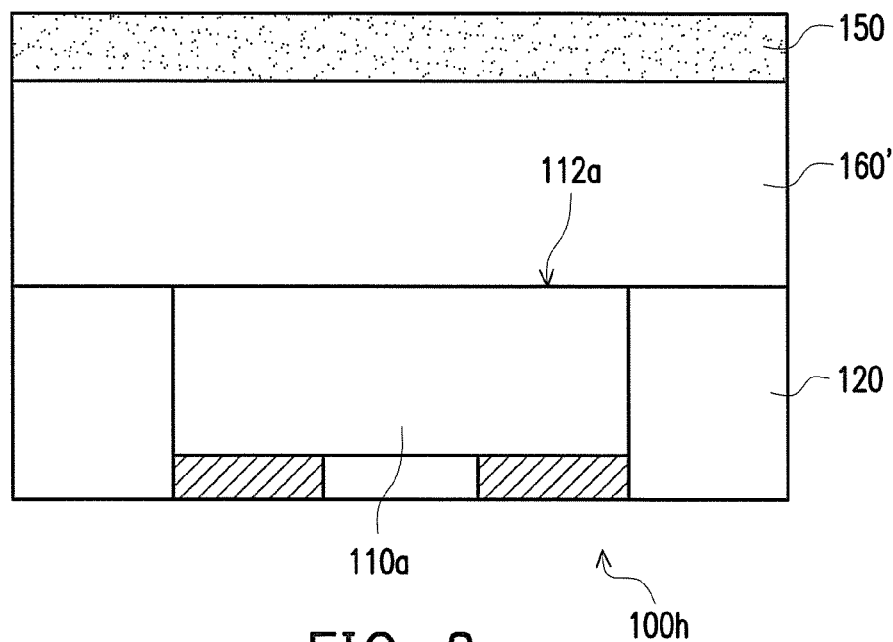
FIG. 8 is a schematic diagram illustrating a light emitting device according to another embodiment of the invention.

FIG. 8 is a schematic diagram illustrating a light emitting device according to another embodiment of the invention. With reference to FIG. 8 and FIG. 7, a light emitting device 100h of the present embodiment is similar to the light emitting device 100g of FIG. 7, and a main difference is that:

a light transmissible layer 160' of the light emitting device 100h of the present embodiment is disposed between the light emitting unit 110a and the encapsulation adhesive layer 150.

Figure 9:
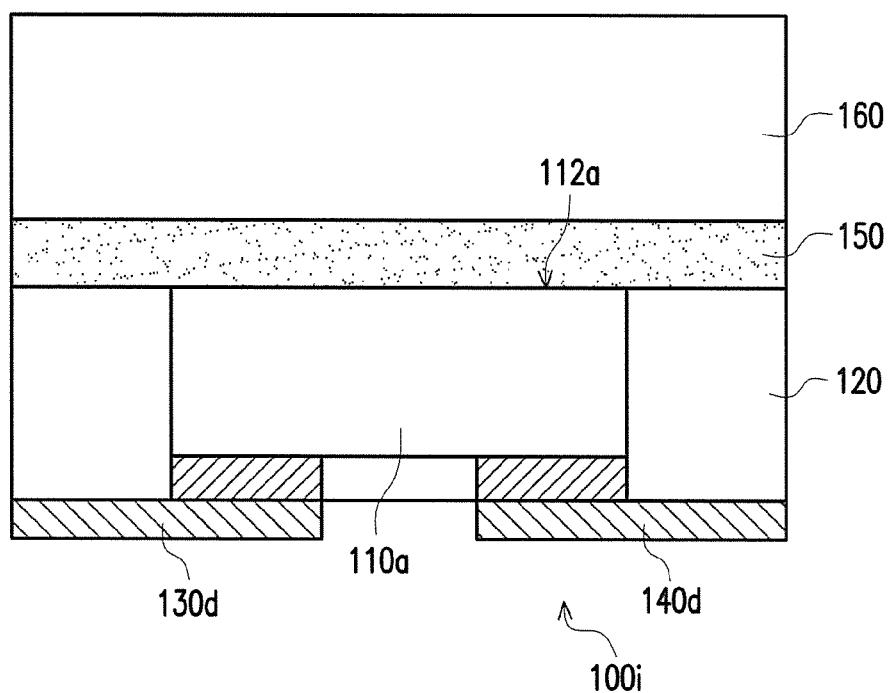
FIG. 9 is a schematic diagram illustrating a light emitting device according to another embodiment of the invention.

FIG. 9 is a schematic diagram illustrating a light emitting device according to another embodiment of the invention. With reference to FIG. 9 and FIG. 6, a light emitting device 100i of the present embodiment is similar to the light emitting device 100f of FIG. 6, and a main difference is that: the light emitting device 100i of the present embodiment further includes a light transmissible layer 160 disposed on the encapsulation adhesive layer 150, wherein a transmittance of the light transmissible layer 160, for example, is greater than 50%. In the present embodiment, a material of the light transmissible layer 160 is glass, ceramics, resins, acrylic, silicone or etc., for example, for guiding the light generated by the light emitting unit 110a to the outside to effectively increase a light flux and a light extraction rate of the light emitting device 100i and for effectively protecting the light emitting unit 110a from influence of external moisture and oxygen.

In the following embodiments, the light emitting devices 100a, 100g, 100d, and 100i of the invention are taken as examples for specifically describing a manufacturing method of the light emitting device of the invention respectively with reference to FIG. 10A to FIG. 10D, FIG. 11A to FIG. 11C, FIG. 12A to FIG. 12E, and FIG. 13A to FIG. 13D.

Figure 10A:
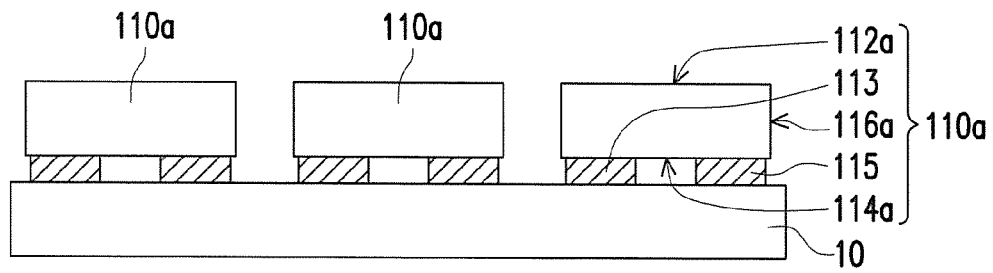
FIG. 10A to FIG. 10D are schematic cross-sectional views illustrating a manufacturing method of a light emitting device according to an embodiment of the invention.

FIG. 10A to FIG. 10D are schematic cross-sectional views illustrating a manufacturing method of a light emitting device according to an embodiment of the invention. With reference to FIG. 10A, first, a plurality of light emitting devices 110a are disposed on a substrate 10, wherein each light emitting unit 110a has an upper surface 112a and a lower surface 114a opposite to each other, a side surface 116a connecting the upper surface 112a and the lower surface 114a, and a first electrode pad 113 and a second electrode pad 115 located on the lower surface 114a and separated from each other. The first electrode pad 113 and the second electrode pad 115 of each light emitting unit 110a are disposed on the substrate 10. In other words, a light emitting surface of the light emitting unit 110a, i.e. the upper surface 112a, is relatively away from the substrate 10. In the present embodiment, a material of the rigid substrate 10 is stainless steel, ceramics, or other non-conductive materials, for example. The light emitting unit 110a, for example, is an LED with a light emitting wavelength (including but not limited thereto) in a range of 315 nanometers to 780 nanometers, and the LED includes but not limited thereto an ultraviolet light LED, a blue light LED, a green light LED, a yellow light LED, an orange light LED or a red light LED.

Figure 10B:
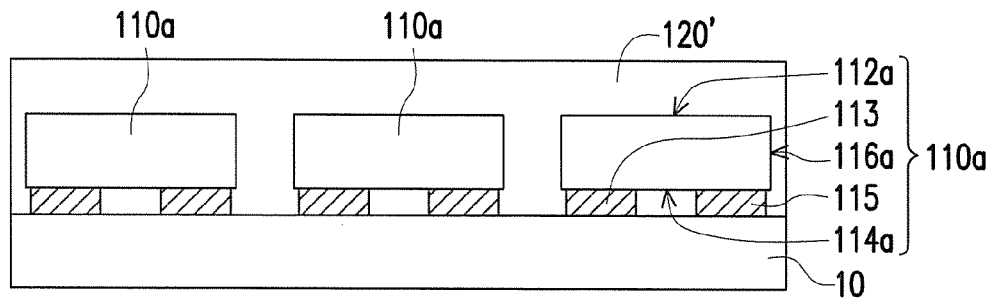

Then, with reference to FIG. 10B, a protecting element 120' is formed on the substrate 10, wherein the protecting element 120' encapsulates each light emitting unit 110a. In other words, the reflective protecting element 120' completely and directly covers the upper surface 112a, the lower surface 114a, and the side surface 116a of the light emitting unit 110a and fills a gap between the first electrode pad 113 and the second electrode pad 115. Here, a reflection rate of the protecting element 120' is at least greater than 90%. That is to say, the protecting element 120' of the present embodiment has a high reflectivity characteristic, wherein a material of the protecting element 120' is a polymer material doped with high reflective particles, the reflective particle, for example but not limited thereto, titanium dioxide ($TiO_2$), and the polymer material, for example but not limited thereto, epoxy or silicone.

Figure 10C:
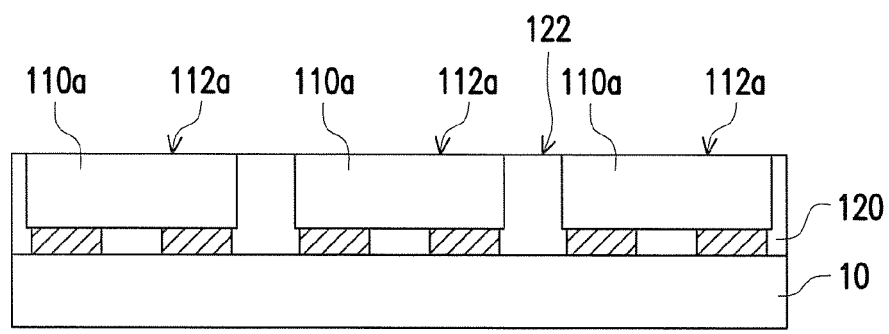

Then, with reference to FIG. 10C, a part of the reflective protecting element 120' is removed to form a reflective protecting element 120, wherein the reflective protecting element 120 exposes the upper surface 112a of each light emitting unit 110a. Moreover, the upper surface 112a of each light emitting unit 110a can be aligned with a top surface 122 of the reflective protecting element 120. Here, a method of removing a part of the reflective protecting element 120' is a grinding method or a polishing method, for example.

Figure 10D:
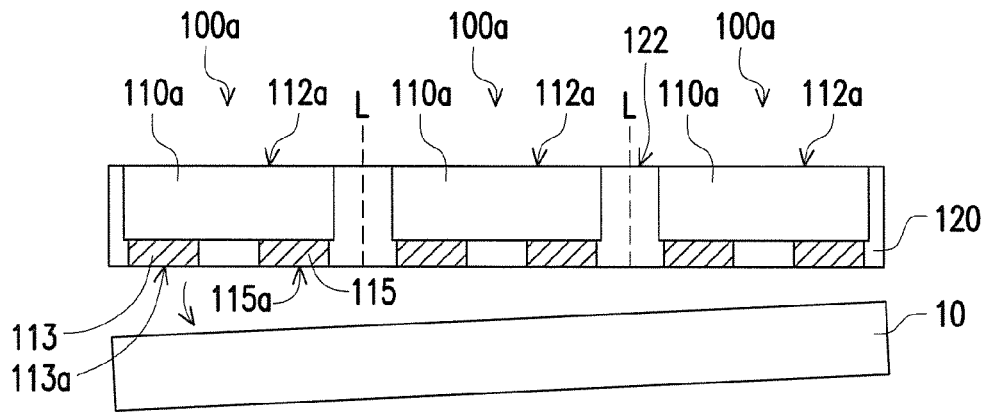

Thereafter, with reference to FIG. 10D, a cutting process is performed to cut the reflective protecting element 120 along a cutting line L so as to form a plurality of light emitting devices 100a separated from each other, wherein each light emitting device 100a includes at least one light emitting unit 110a and the reflective protecting element 120 encapsulating the side surface 116a of the light emitting unit 110a and exposing the upper surface 112a.

Finally, with reference to FIG. 10D, the substrate 10 is removed to expose a bottom surface 124 of the reflective protecting element 120 of each light emitting device 100a, a first bottom surface 113a of the first electrode pad 113 and a second bottom surface 115a of the second electrode pad 115.

Figure 11A:
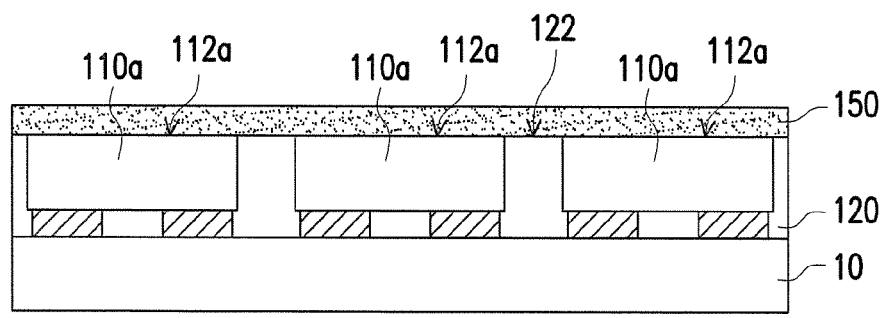
FIG. 11A to FIG. 11C are schematic cross-sectional views illustrating partial steps of a manufacturing method of a light emitting device according to another embodiment of the invention.
Figure 11B:
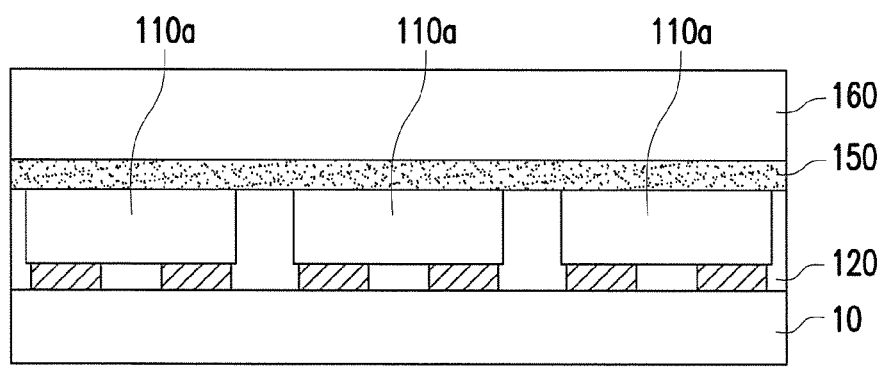
Figure 11C:
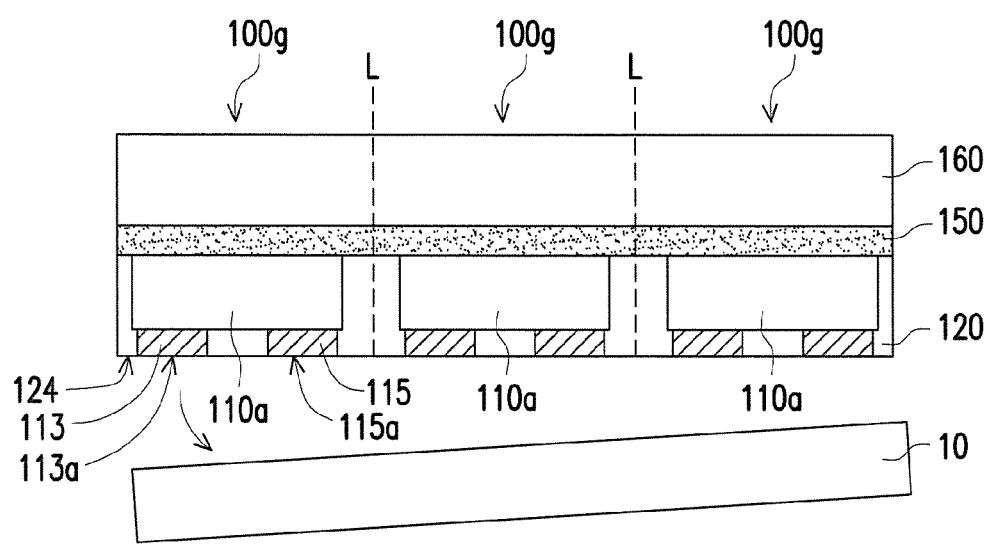

FIG. 11A to FIG. 11C are schematic cross-sectional views illustrating partial steps of a manufacturing method of a light emitting device according to another embodiment of the invention. The manufacturing method of the light emitting device of the present embodiment is similar to the manufacturing method of the light emitting device of FIG. 10A to FIG. 10D, and a main difference is that: between the steps of FIG. 10C and FIG. 10D, namely, after removing a part of the reflective protecting element 120' and before performing the cutting process, with reference to FIG. 11A, an encapsulation adhesive layer 150 is formed on the light emitting unit 110a and the reflective protecting element 120 to increase the light extraction rate and improve the light pattern. Here, the encapsulation adhesive layer 150 covers the upper surface 112a of the light emitting unit 110a and the top surface 122 of the reflective protecting element 120, and at least one wavelength converting material can be doped in the encapsulation adhesive layer 150. The relevant illustration of the wavelength converting material can be referred to the aforementioned embodiments. In addition, an oxide having high scattering ability, such as titanium dioxide ($TiO_2$) or silicon dioxide ($SiO_2$) may be doped in the encapsulation adhesive layer 150 to increase the light emitting efficiency.

Then, with reference to FIG. 11B, a light transmissible layer 160 is formed on the light emitting unit 110a and the reflective protecting element 120, wherein the light transmissible layer 160 is located on the encapsulation adhesive layer 150 and covers the encapsulation adhesive layer 150. For example, a transmittance of the light transmissible layer 160 is greater than 50%. In the present embodiment, a material of the light transmissible layer 160 is glass, ceramics, resins, acrylic, silicone or etc., for example, for guiding the light generated by the light emitting unit 110a to the outside to effectively increase a light flux and a light extraction rate of the light emitting device 100g formed in the subsequent process and for effectively protecting the light emitting unit 110a from influence of external moisture and oxygen.

Thereafter, with reference to FIG. 11C, a cutting process is performed to cut the light transmissible layer 160, the encapsulation adhesive layer 150, and the reflective protecting element 120 along a cutting line L so as to form a plurality of light emitting devices 100g separated from each other. Finally, with reference to FIG. 11C, the substrate 10 is removed to expose a bottom surface 124 of the reflective protecting element 120 of each light emitting device 100g, wherein the bottom surface 124 of the reflective protecting element 120 of each light emitting device 100g exposes to a first bottom surface 113a of the first electrode pad 113 and a second bottom surface 115a of the second electrode pad 115. In another embodiment, the cutting process can be performed after removing the another substrate 10.

FIG. 12A to FIG. 12E are schematic cross-sectional views illustrating a manufacturing method of a light emitting device according to another embodiment of the invention. First, with reference to FIG. 12A, the manufacturing method of the light emitting device of the present embodiment is similar to the manufacturing method of the light emitting device of FIG. 10A to FIG. 10D, and a main difference is that: with reference to FIG. 12A, the light emitting unit 110a of the present embodiment is not contact with the substrate 10 through the first electrode pad 113 and the second electrode pad 115, but through the upper surface 112a.

Figure 12A:
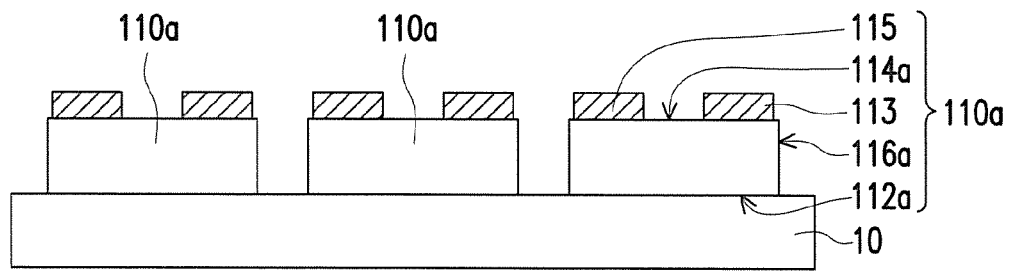
FIG. 12A to FIG. 12E are schematic cross-sectional views illustrating a manufacturing method of a light emitting device according to another embodiment of the invention.
Figure 12B:
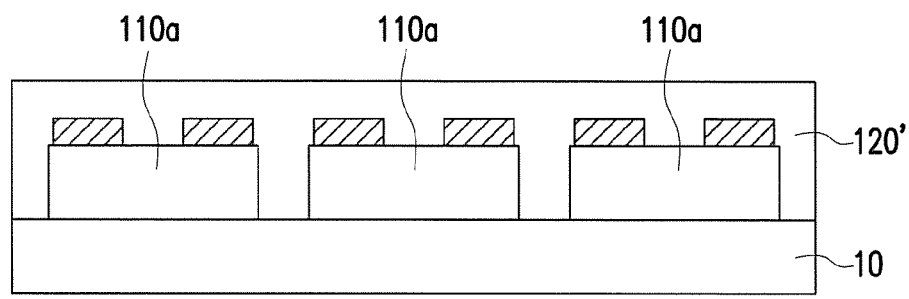

Then, with reference to FIG. 12B, a reflective protecting element 120' is formed on the substrate 10, wherein the protecting element encapsulates each light emitting unit 110a.

Figure 12C:
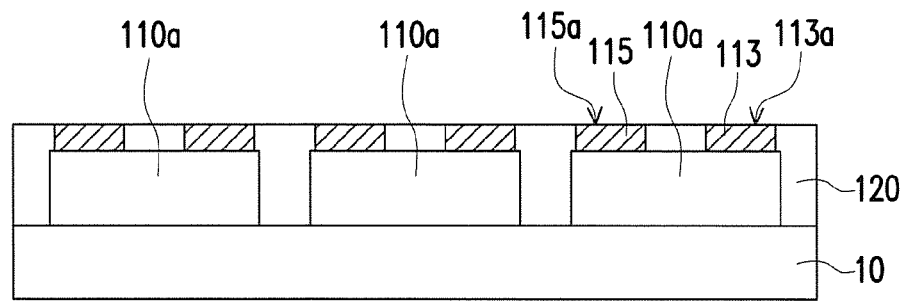

Next, with reference to FIG. 12C, a part of the reflective protecting element 120' is removed to form a reflective protecting element 120, wherein the reflective protecting element 120 exposes a first bottom surface 113a of the first electrode pad 113 and a second bottom surface 115a of the second electrode pad 115 of each light emitting unit 110a.

Figure 12D:
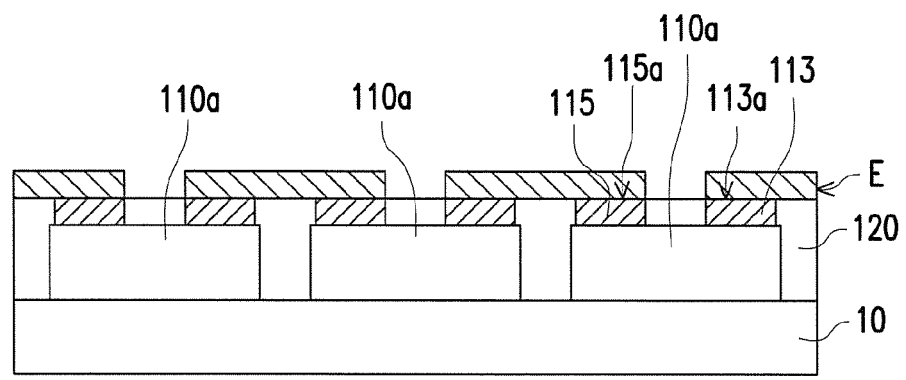

Then, with reference to FIG. 12D, a patterned metal layer is formed as an extension electrode layer E which is located on the first bottom surface 113a of the first electrode pad 113 and the second bottom surface 115a of the second electrode pad 115 of each light emitting unit 110a. Here, a method of forming the extension electrode layer E is a vapor deposition method, a sputtering method, a plating method, a chemical plating method or a mask etching method, for example.

Figure 12E:
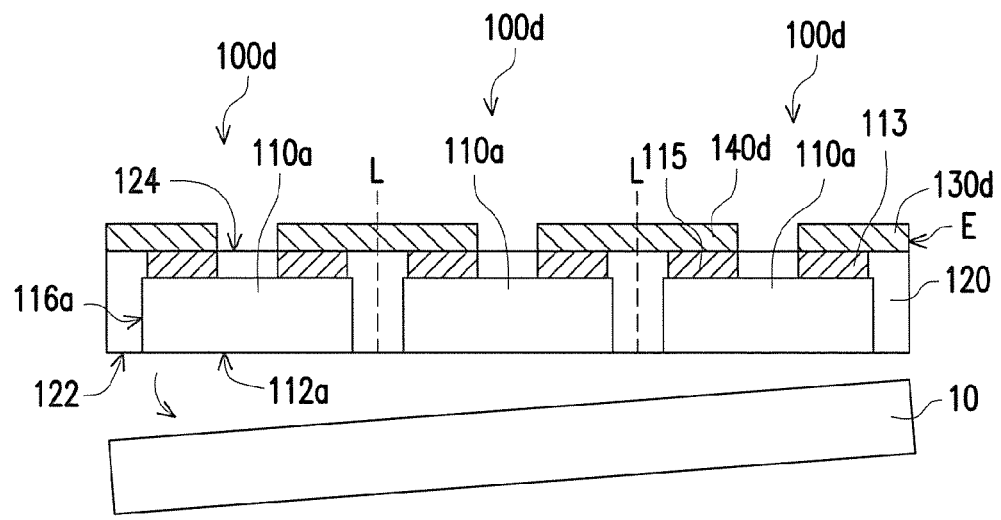

Thereafter, with reference to FIG. 12E, a cutting process is performed to cut the extension electrode layer E and the reflective protecting element 120 along a cutting line so as to form a plurality of light emitting device 100d separated from each other, wherein each light emitting device 100d includes at least one light emitting unit 110a, the reflective protecting element 120 at least encapsulating the side surface 116a of the light emitting unit 110a, a first extension electrode 130d in direct contact with the first electrode pad 113, and a second extension electrode 140d in direct contact with the second electrode pad 115. The first extension electrode 130d and the second extension electrode 140d are separated from each other and expose a part of the bottom surface 124 of the reflective protecting element 120. At the moment, the area of the first extension electrode 130d can be larger than the area of the first electrode pad 113 and the area of the second extension electrode 140d is larger than the area of the second electrode pad 115. An edge of the first extension electrode 130d and an edge of the second extension electrode 140d are aligned with an edge of the reflective protecting element 120.

Finally, with reference to FIG. 12E, the substrate 10 is removed to expose the top surface 122 of the reflective protecting element 120 and the upper surface 112a of the light emitting unit 110a of each light emitting device 100d, wherein the top surface 122 of the reflective protecting element 120 of each light emitting device 100d is aligned with the upper surface 112a of the light emitting unit 110a. In another embodiment, the cutting process can be performed after removing the another substrate 10.

FIG. 13A to FIG. 13D are schematic cross-sectional views illustrating partial steps of a manufacturing method of a light emitting device according to another embodiment of the invention. The manufacturing method of the light emitting device of the present embodiment is similar to the manufacturing method of the light emitting device of FIG. 12A to FIG. 12E, and a main difference is that: between the steps of FIG. 12D and FIG. 12E, namely, after forming the extension electrode layer E and before performing the cutting process, with reference to FIG. 13A, another substrate 20 is provided and disposed on extension electrode layer E. Here, a material of the another substrate 20 is stainless steel, ceramics, or other non-conductive materials, for example. Then, with reference to FIG. 13A again, after providing another substrate 20, the substrate 10 is removed to expose the top surface 122 of the reflective protecting element 120 and the upper surface 112a of the light emitting unit 110a, wherein the upper surface 112a of each light emitting unit 110a is aligned with the top surface 122 of the reflective protecting element 120.

Figure 13A:
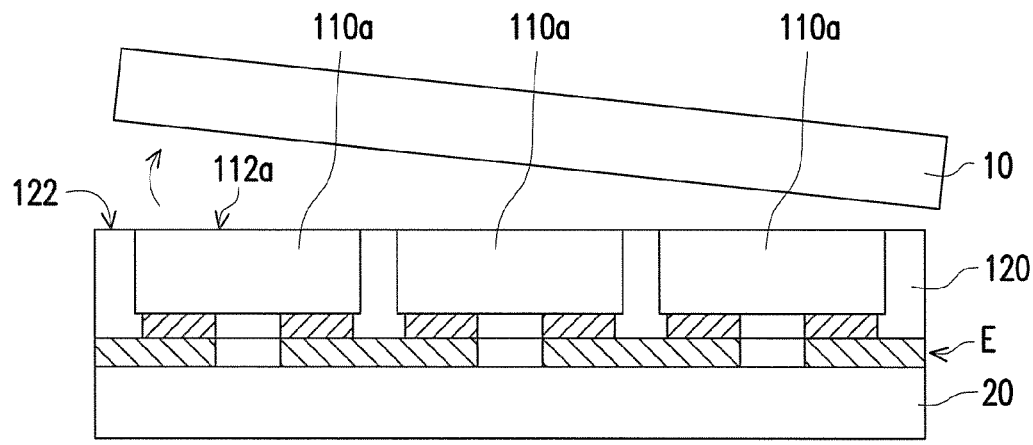
FIG. 13A to FIG. 13D are schematic cross-sectional views illustrating partial steps of a manufacturing method of a light emitting device according to another embodiment of the invention.
Figure 13B:
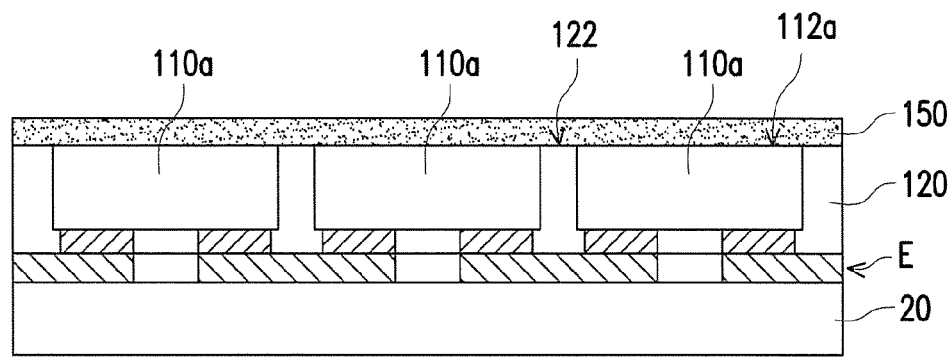

Next, with reference to FIG. 13B, an encapsulation adhesive layer 150 is formed on the light emitting unit 110a and the reflective protecting element 120 to increase the light extraction rate and improve the light pattern. Here, the encapsulation adhesive layer 150 covers the upper surface 112a of the light emitting unit 110a and the top surface 122 of the reflective protecting element 120, and at least one wavelength converting material can be doped in the encapsulation adhesive layer 150. The relevant illustration of the wavelength converting material can be referred to the aforementioned embodiments. In addition, an oxide having high scattering ability, such as titanium dioxide ($TiO_2$) or silicon dioxide ($SiO_2$) may be doped in the encapsulation adhesive layer 150 to increase the light emitting efficiency.

Figure 13C:
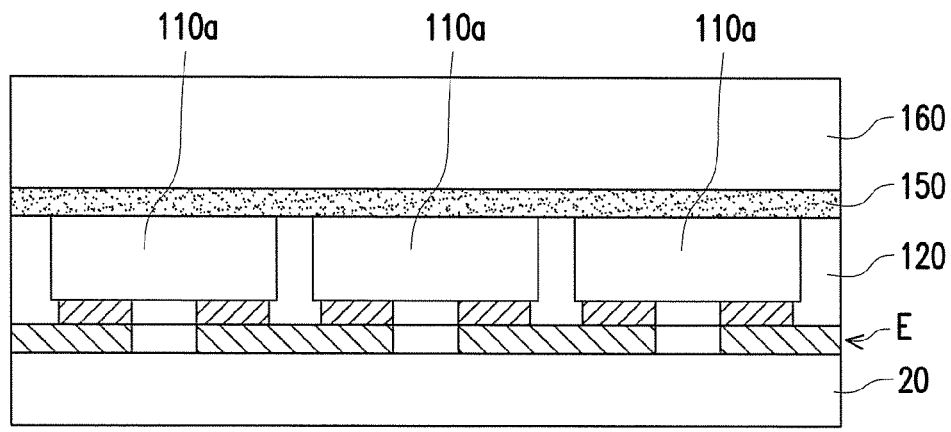

Then, with reference to FIG. 13C, a light transmissible layer 160 is formed on the light emitting unit 110a and the reflective protecting element 120, wherein the light transmissible layer 160 is located on the encapsulation adhesive layer 150 and covers the encapsulation adhesive layer 150. For example, a transmittance of the light transmissible layer 160 is greater than 50%. Here, a material of the light transmissible layer 160 is glass, ceramics, resins acrylic, silicone or etc, for example, for guiding the light generated by the light emitting unit 110a to the outside to effectively increase a light flux and a light extraction rate of the light emitting device 100i formed in the subsequent process and for effectively protecting the light emitting unit 110a from influence of external moisture and oxygen.

Figure 13D:
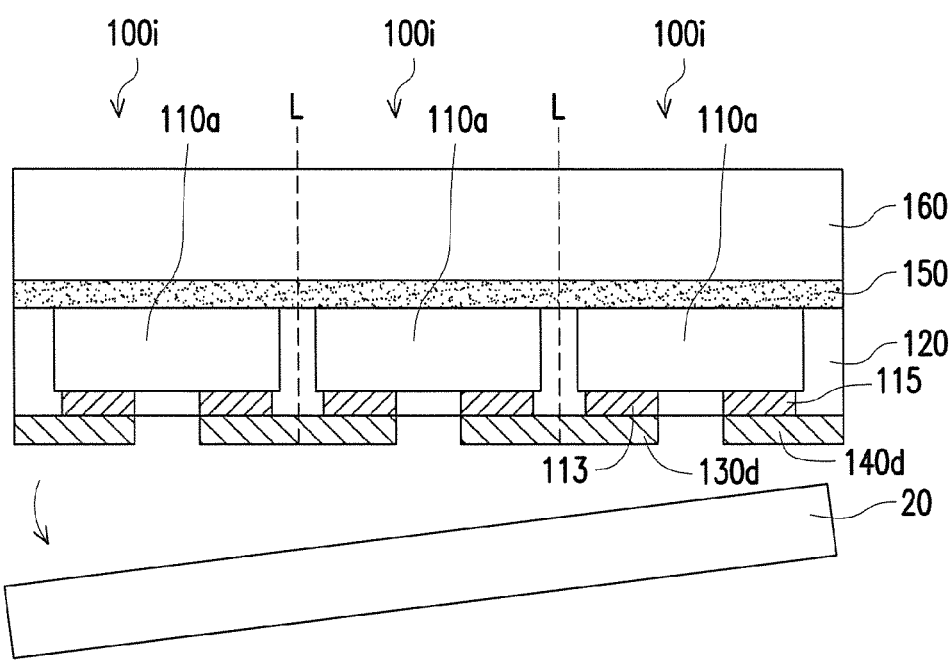

Thereafter, with reference to FIG. 13D, a cutting process is performed to cut the light transmissible layer 160, the encapsulation adhesive layer 150, the reflective protecting element 120 and extension electrode layer E along a cutting line L so as to form a plurality of light emitting devices 100i separated from each other. Finally, with reference to FIG. 13D, the another rigid substrate 20 is removed to expose the first extension electrode 130d and the second extension electrode 140d of each light emitting device 100. In another embodiment, the cutting process can be performed after removing the another substrate 20.

FIG. 14A to FIG. 14E are schematic cross-sectional views illustrating a manufacturing method of a light emitting device according to another embodiment of the invention. Please refer to FIG. 14A first, a wavelength conversion layer 170 is provided, wherein the wavelength conversion layer 170 includes a low concentration fluorescent layer 174 and a high concentration fluorescent layer 172 located on the low concentration fluorescent layer 174. Here, the steps of forming the wavelength conversion layer 170 is, for example, forming the wavelength conversion resin layer 170 by ways of mixing dopant and resin (i.e. evenly mixing the resin in liquid state or in molten with the wavelength conversion material, the wavelength conversion material is, for example, fluorescent powder but not limited thereto) first, then placing the wavelength conversion resin layer 170 for a period of time, for example, 24 hours for sedimentation, and the high concentration fluorescent resin layer 172 and the low concentration fluorescent resin layer 174 which are separated in a form of upper and lower layers. That is, the wavelength conversion resin layer 170 is taking two-layered resin layer for example. Then two-layered wavelength conversion layer 170 of present embodiment is formed after curing. Certainly, in another embodiment, with reference to FIG. 14A', a wavelength conversion layer 170' is provided, wherein the wavelength conversion layer 170' is a single layer.

Figure 14A:
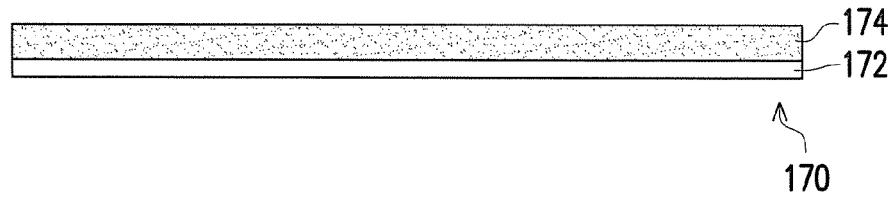
FIG. 14A to FIG. 14E are schematic cross-sectional views illustrating a manufacturing method of a light emitting device according to another embodiment of the invention.
Figure 14A:
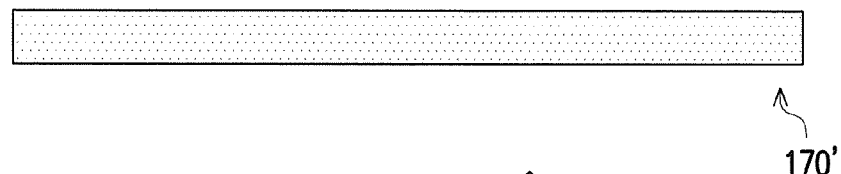
Figure 14B:
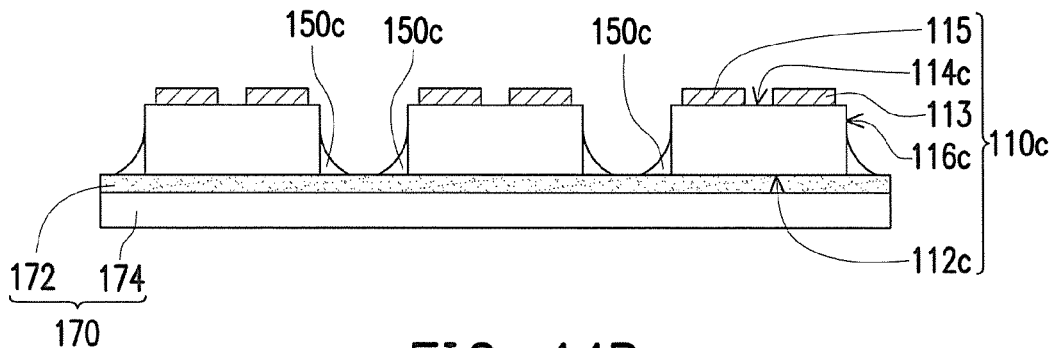
Figure 14B:
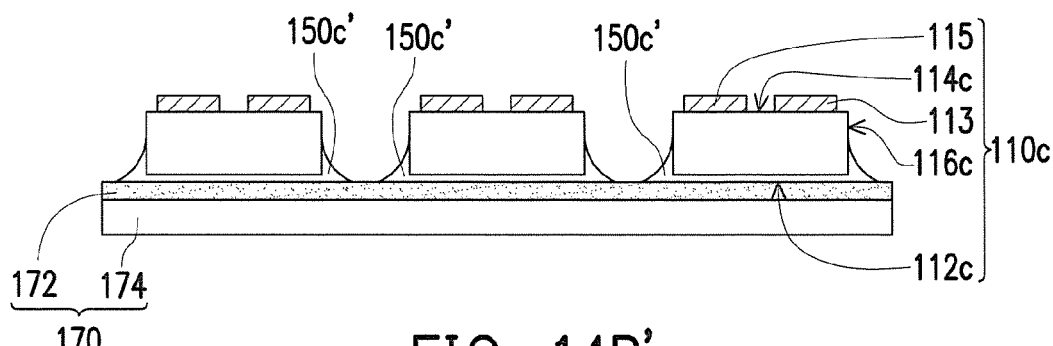

Then, with reference to FIG. 14B, a plurality of light emitting units 110c arranged at intervals are disposed on the wavelength conversion layer 170, wherein each light emitting unit 110c has an upper surface 112c and a lower surface 114c opposite to each other, a side surface 116c connecting the upper surface 112c and the lower surface 114c, and a first electrode pad 113 and a second electrode pad 115 located on the lower surface 114c and separated from each other, and the upper surface 112c of the light emitting unit 110c is located on the high concentration fluorescent layer 172 of the wavelength conversion layer 170. After that, a plurality of adhesive layers 150c having a material containing transparent resin are formed on the wavelength conversion layer 170 and extending on a side surface 116c of the light emitting unit 110c, wherein the adhesive layers 150c are not completely covered the side surface 116c of the light emitting units 110c, but as shown in FIG. 14B, the adhesive layer 150c has a inclined surface having a curvature, and the closer to the light emitting unit 110c, the thicker of the adhesive layer 150c. Here, the purpose of setting the adhesive layers 150c is fixing the position of the light emitting units 110c.

It must be noted that, in other embodiment, with reference to FIG. 14B', an uncured adhesive layer 150c' having a material containing transparent resin may be also formed on the wavelength conversion layer 170 before disposing the light emitting units 110c arranged at intervals on the wavelength conversion layer 170. And the adhesive layer 150c' may extends to be disposed between the light emitting unit 110c and the high concentration fluorescent layer 172 after disposing the light emitting units 110c arranged at intervals on the wavelength conversion layer 170.

Figure 14C:
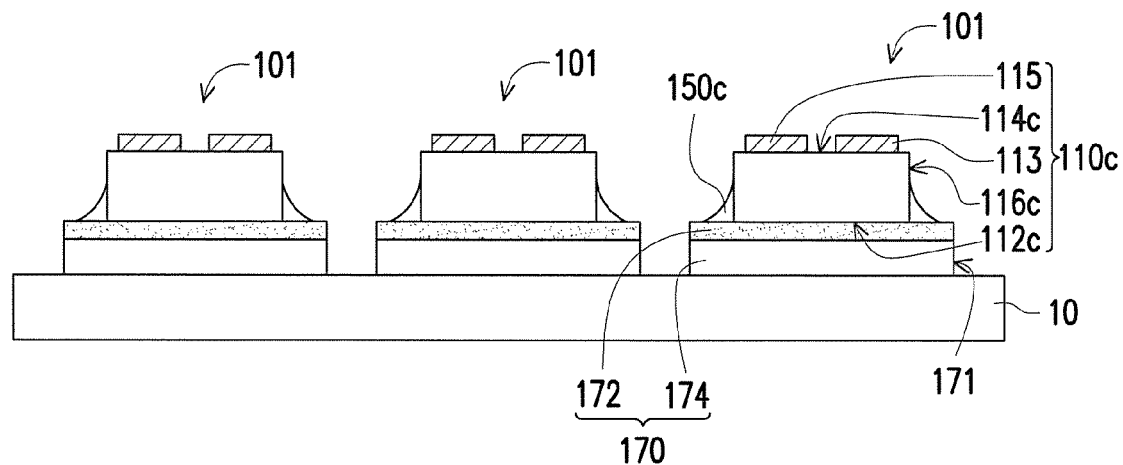

Thereafter, with reference to FIGS. 14B and 14C, a first cutting process is performed to cut the wavelength conversion layer 170 so as to form a plurality of units 101 separated from each other after curing the adhesive layers 150c, wherein each unit 101 includes at least one light emitting unit 110c and the wavelength conversion layer 170 disposed on the upper surface 112c of the light emitting unit 110c, and a side surface 171 of the wavelength conversion layer 170 of each unit 101 extends outside the side surface 116c of the light emitting unit 110c. Then, with reference to FIG. 14C, the units 101 arranged at intervals are disposed on a substrate 10. In the present embodiment, a material of the rigid substrate 10 is stainless steel, ceramics, or other non-conductive materials but not limited thereto. In another embodiment, a first cutting process cutting the wavelength conversion layer 170 is performed before disposing the light emitting units 110c on the wavelength conversion layer 170. A patterned wavelength conversion layer 170 is formed after cutting process, and the light emitting units 110c are disposed on the patterned wavelength conversion layer 170.

Figure 14D:
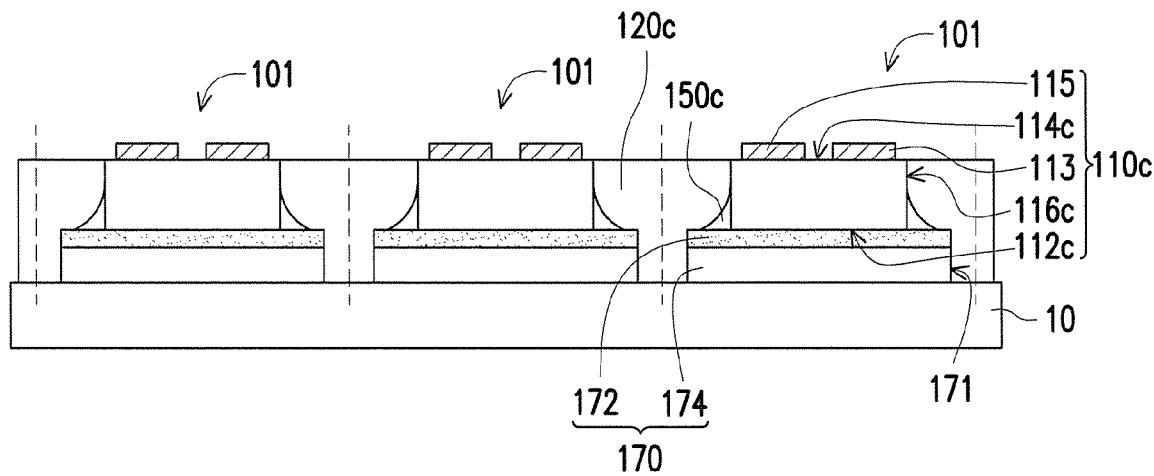

Then, with reference to FIG. 14D, a reflective protecting element 120c is formed on the substrate 10, and the reflective protecting element 120c encapsulates the side surface 116c of the light emitting unit 110c of each unit 101 and the side surface 171 of the wavelength conversion layer 170. Here, the way of forming the reflective protecting element 120c is, for example, performing by dripping, wherein the reflective protecting element 120c directly encapsulates adhesive layer 150c and extends to encapsulate the side surface 171 of the wavelength conversion layer 170 along the adhesive layer 150c. The reflective protecting element 120c is not over the first electrode pad 113 and the second electrode pad 115 of the light emitting unit 110c. Here, the reflective protecting element 120c is, for example, a white resin layer.

Figure 14E:
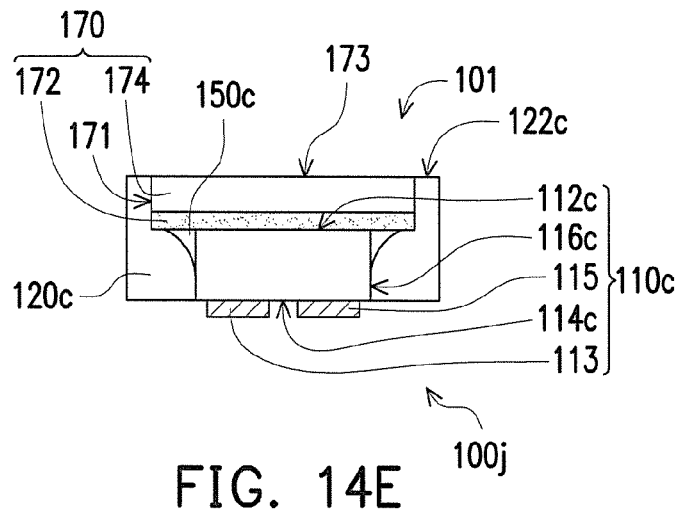

Finally, with reference to both FIG. 14D and FIG. 14E, a second cutting process is performed to cut the reflective protecting element 120c and remove the substrate 10 so as to form a plurality of light emitting devices 100j separated from each other. Each light emitting device 100j includes at least one light emitting unit 110c and the reflective protecting element 120c encapsulating the side surface 116c of the light emitting unit 110c and the side surface 171 of the wavelength conversion layer 170. a top surface 122c of the reflective protecting element 120c of each light emitting device 100j and a top surface 173 of the wavelength conversion layer 170 are exposed after removing the substrate 10. In another embodiment, the cutting process may be performed after removing the substrate 10. So far, the light emitting device 100j is completely manufactured.

With reference to FIG. 14E, on the structure, the light emitting device 100j of the present embodiment includes the light emitting unit 110c, the reflective protecting element 120c, the adhesive layer 150c and the wavelength conversion layer 170. The wavelength conversion layer 170 is disposed on the upper surface 112c of the light emitting unit 110c, wherein the wavelength conversion layer 170 includes the low concentration fluorescent layer 174 and the high concentration fluorescent layer 172, the high concentration fluorescent layer 172 is located between the low concentration fluorescent layer 174 and the light emitting unit 110c, and the side surface 171 of the wavelength conversion layer 170 extends outside the side surface 116c of the light emitting unit 110c. Here, the low concentration fluorescent layer 174 can be used for a transparent protective layer so as to increase paths for water vapor transmission and effectively prevent the infiltration of water vapor. The adhesive layer 150c is disposed between the side surface 116c of the light emitting unit 110c and the reflective protecting element 120c so as to fix the position of the light emitting unit 110c. The reflective protecting element 120c encapsulates along the adhesive layer 150c of the side surface 116c of the light emitting unit 110c, and further encapsulates the side surface 171 of the wavelength conversion layer 170, therefore, the light emitting device 100j of the present embodiment not only does not require a conventional carrying support to support and fix the light emitting unit 110c, may effectively lower the thickness and manufacturing cost of the package. At the same time, the forward light emitting efficiency of the light emitting unit 110c may also be effectively increased through the reflective protecting element 120 having high reflectivity. Here, in particular, the top surface 122c of the reflective protecting element 120c is aligned with the top surface 173 of the wavelength conversion layer 170.

Figure 14F:
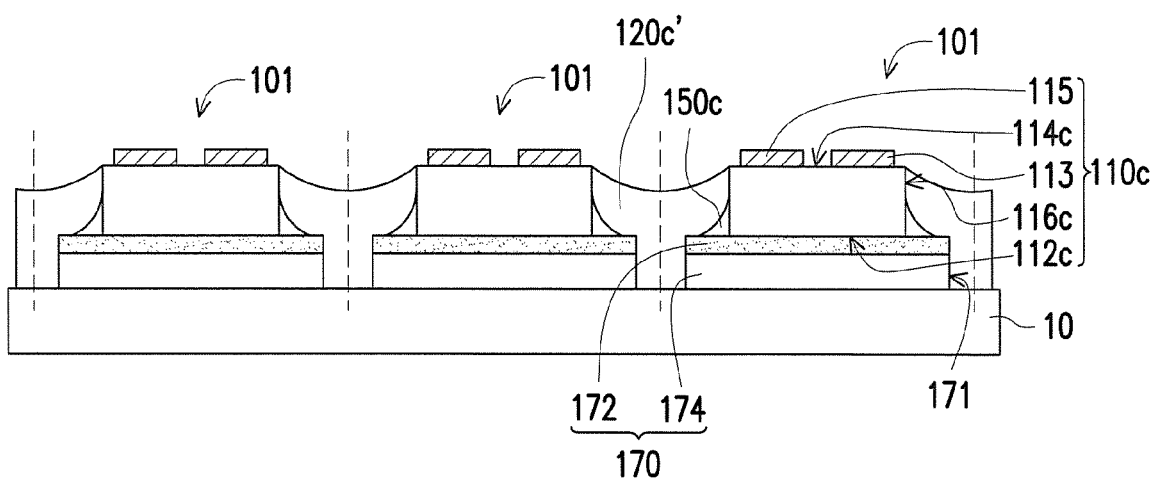
FIG. 14F to FIG. 14G are schematic cross-sectional views illustrating a part of a manufacturing method of a light emitting device according to another embodiment of the invention.
Figure 14G:
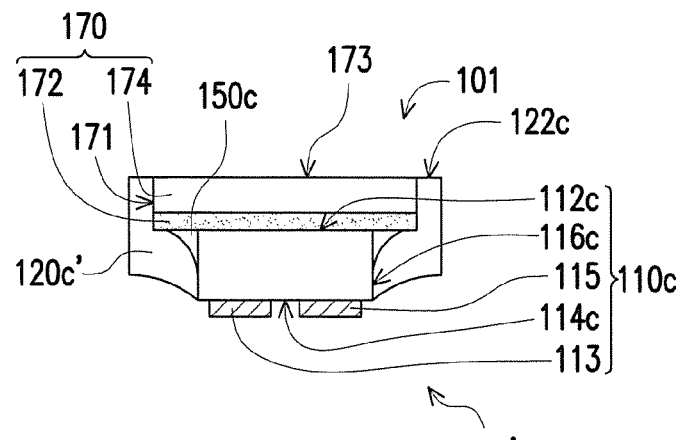

FIG. 14F to FIG. 14G are schematic cross-sectional views illustrating a part of a manufacturing method of a light emitting device according to another embodiment of the invention. Please refer to FIG. 14F first, the manufacturing method of the light emitting device includes, for example, a part of the manufacturing method of the light emitting device illustrated in FIG. 14A to FIG. 14C. Besides, a reflective protecting element 120c' is formed on the substrate 10, and the reflective protecting element 120c' encapsulates the side surface 116c of the light emitting unit 110c of each unit 101 and the side surface 171 of the wavelength conversion layer 170 to form a device similar with that in FIG. 14E. However, the difference of the reflective protecting element 120c' and the reflective protecting element 120c is that a surface of the reflective protecting element 120c' away from the substrate 10 has a recess with respect to the lower surface 114c of the light emitting unit 110c. Please refer to both FIG. 14F and FIG. 14G, a second cutting process is performed to cut the reflective protecting element 120c' and remove the substrate 10 so as to form a plurality of light emitting devices 100j' separated from each other. the reflective protecting element 120c' of the light emitting devices 100j'. Particularly, since the surface of the reflective protecting element 120c' away from the substrate 10 has the recess with respect to the lower surface 114c of the light emitting unit 110c in the manufacturing method of the light emitting device according to the embodiment of the invention, the reflective protecting element 120c' is not easy to being overflowed to cover the lower surface 114c and affect the contact of the first electrode pad 113 and the second electrode pad 115.

FIG. 15A to FIG. 15E are schematic cross-sectional views illustrating a manufacturing method of a light emitting device according to another embodiment of the invention. Please refer to FIG. 15A first, a first release film 30 is provided, then, a wavelength conversion layer 170a is provided on the first release film 30, the wavelength conversion layer 170a may be a single layer or a multi-layer, in present embodiment, the wavelength conversion layer 170a includes a low concentration fluorescent layer 174a and a high concentration fluorescent layer 172a located on the low concentration fluorescent layer 174a. Here, the steps of forming the wavelength conversion layer 170a is, for example, forming the wavelength conversion layer 170a by ways of mixing dopant and resin first, then placing the wavelength conversion resin layer 170a for a period of time, for example, 24 hours, and the low concentration fluorescent resin layer 174a and the high concentration fluorescent resin layer 172a separated from each other are formed. Then two-layered wavelength conversion layer 170a of present embodiment is formed after curing. Here, the first release film is, for example, a double-sided adhesive film.

Figure 15A:
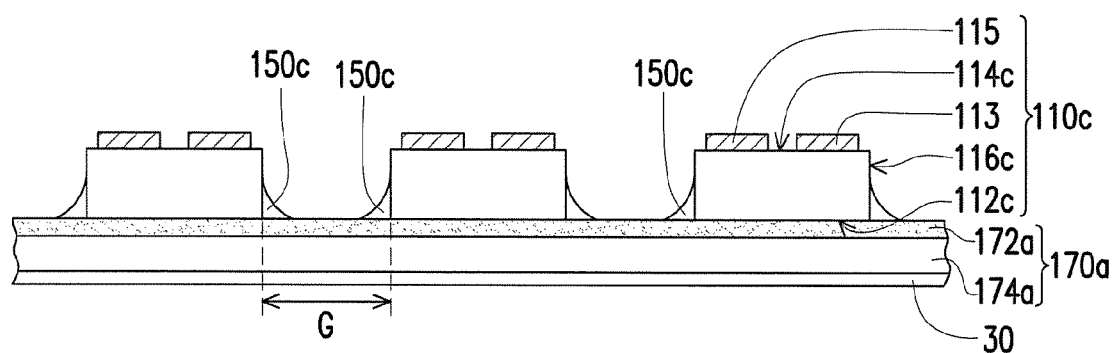
FIG. 15A to FIG. 15E are schematic cross-sectional views illustrating a manufacturing method of a light emitting device according to another embodiment of the invention.
Figure 15B:
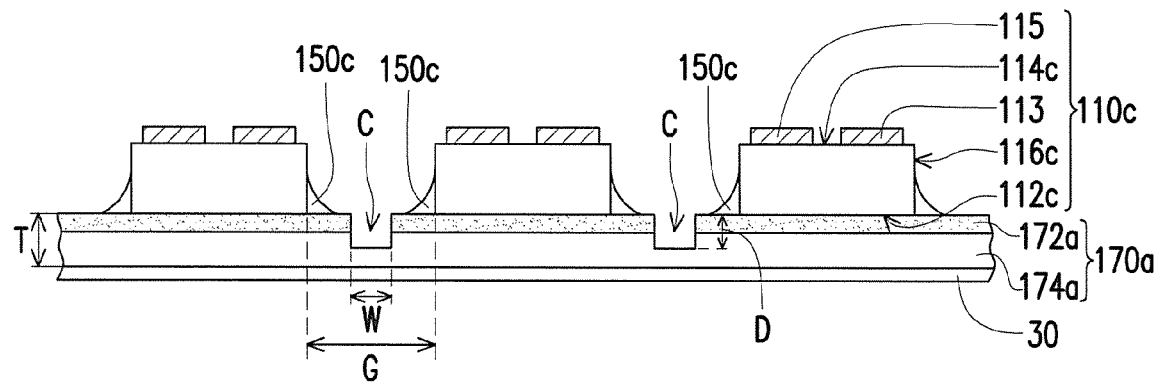

Then, with reference to FIG. 15A, a plurality of light emitting units 110c arranged at intervals are disposed on the wavelength conversion layer 170a, wherein each light emitting unit 110c has an upper surface 112c and a lower surface 114c opposite to each other, a side surface 116c connecting the upper surface 112c and the lower surface 114c, and a first electrode pad 113 and a second electrode pad 115 located on the lower surface 114c and separated from each other, and the upper surface 112c of the light emitting unit 110c is located on the high concentration fluorescent layer 172a of the wavelength conversion layer 170a. Here, two adjacent light emitting units 110c have a gap G therebetween, and the gap G is, for example, 700 micrometers. After that, a plurality of adhesive layers 150c are formed on the side surface 116c of the light emitting units 110c, wherein the adhesive layers 150c are not completely covered the side surface 116c of the light emitting units 110c, but as shown in FIG. 15B, the adhesive layer 150c has an inclined surface having a curvature, and the closer to the light emitting unit 110c, the thicker of the adhesive layer 150c. Here, the purpose of setting the adhesive layers 150c is fixing the position of the light emitting unit 110c. The adhesive layers 150c may be also formed on the wavelength conversion layer 170a before disposing the light emitting units 110c on the wavelength conversion layer 170a.

Then, with reference to FIG. 15B, a first cutting process is performed to cut the high concentration fluorescent layer 172a and a portion of the low concentration fluorescent layer 174a so as to form a plurality of trenches C. With reference to FIG. 15B, the wavelength conversion layer 170a is not completely cut in the first cutting process, only the high concentration fluorescent layer 172a is completely cut and a portion of the low concentration fluorescent layer 174a is cut in the first cutting process. Here, a width W of the trench C is, for example, 400 micrometers, and a depth D of the trench C is, for example, a half of a thickness T of the wavelength conversion layer 170a. The thickness T of the wavelength conversion resin layer 170a is, for example, 140 micrometers, and the depth D of the trench C is, for example, 70 micrometers. At this time, the position of the trench C and the position of the adhesive layer 150c do not interfere with each other. In another embodiment, a first cutting process cutting the high concentration fluorescent layer 172a and a portion of the low concentration fluorescent layer 174a is performed before disposing the light emitting units 110c on the wavelength conversion layer 170a. A patterned wavelength conversion layer 170a is formed after cutting process, and the light emitting units 110c are disposed on the patterned wavelength conversion layer 170a.

Figure 15C:
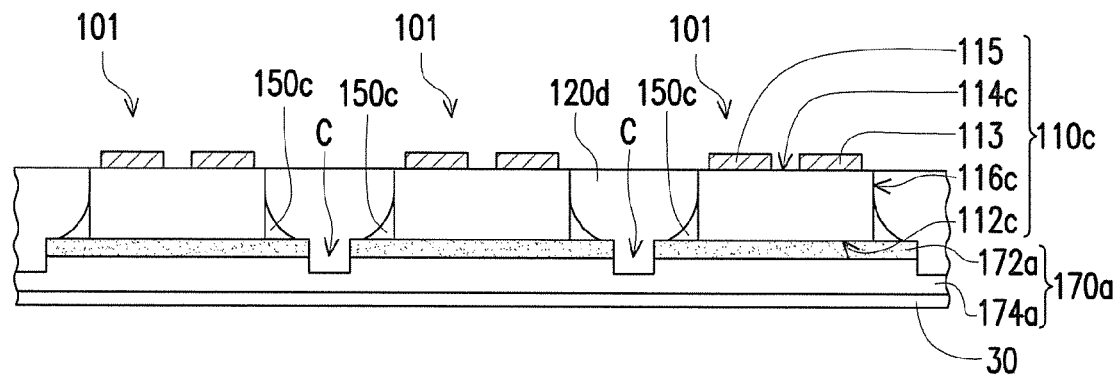

Then, with reference to FIG. 15C, a reflective protecting element 120d is formed on the low concentration fluorescent layer 174a, and the reflective protecting element 120d encapsulates the side surface 116c of the light emitting units 110c, wherein the reflective protecting element 120d completely fills in the trench C and exposes the first electrode pad 113 and the second electrode pad 115 of the light emitting unit 110c. Here, the reflective protecting element 120d is, for example, a white resin layer.

Figure 15D:
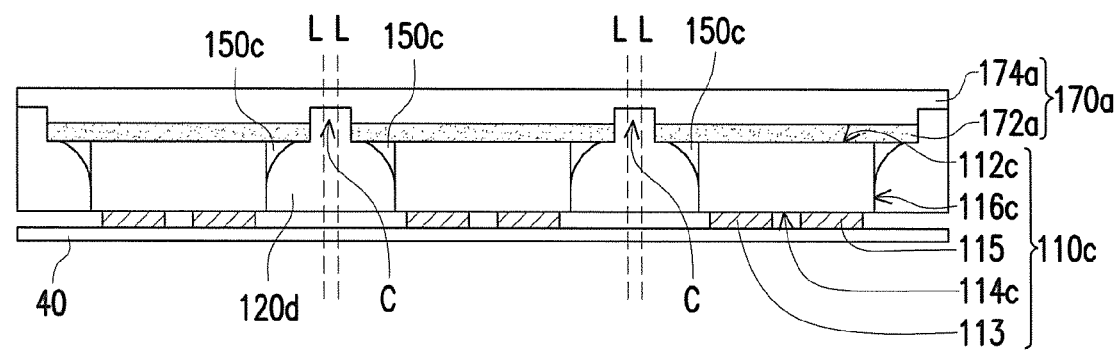
Figure 15E:
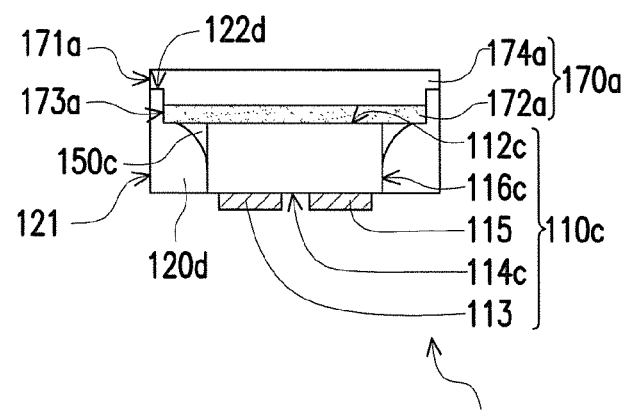

Finally, with reference to FIG. 15D and FIG. 15E, the first release layer 30 is removed, and a second release layer 40 is provided so that the first electrode pad 113 and the second electrode pad 115 of the light emitting unit 110c attach on the second release layer 40. Here, the second release layer 40 is, for example, an ultraviolet adhesive or a double-sided adhesive. Thereafter, a second cutting process is performed to cut the reflective protecting element 120d and the low concentration fluorescent layer 174a along an extending direction of the trench C (i.e. the extending direction of a cutting line L in FIG. 15D) so as to form a plurality of light emitting devices 100k separated from each other. Each light emitting device 100k includes at least one light emitting unit 110c, the wavelength conversion layer 170a disposing on the upper surface 112a of the light emitting unit 110c and the reflective protecting element 120d encapsulating the side surface 116c of the light emitting unit 110c respectively. In present embodiment, the wavelength conversion layer 170a includes the high concentration fluorescent layer 172a and the low concentration fluorescent layer 174a, here, the side surface 171a of the low concentration fluorescent layer 174a of the wavelength conversion layer 170a is aligned with the side surface 121 of the reflective protecting element 120*d*, and the reflective protecting element 120*d* further encapsulates the side surface 173*a* of the high concentration fluorescent layer 172*a*. The second release layer 40 is removed, and the light emitting device 100*k* is completely manufactured.

With reference to FIG. 15E, on the structure, the light emitting device 100*k* of the present embodiment includes the light emitting unit 110*c*, the reflective protecting element 120*d*, the adhesive layer 150*c* and the wavelength conversion layer 170*a*. The wavelength conversion resin layer 170*a* is disposed on the upper surface 112*c* of the light emitting unit 110*c*, wherein the wavelength conversion layer 170*a* includes the low concentration fluorescent layer 174*a* and the high concentration fluorescent layer 172*a*. The high concentration fluorescent layer 172*a* is located between the low concentration fluorescent layer 174*a* and the light emitting unit 110*c*, and the side surface 171*a* of the wavelength conversion layer 170*a* extends outside the side surface 116*c* of the light emitting unit 110*c*. Here, the low concentration fluorescent layer 174 may be used for a transparent protective layer so as to increase paths for water vapor transmission and effectively prevent the infiltration of water vapor. The adhesive layer 150*c* is disposed between the side surface 116*c* of the light emitting unit 110*c* and the reflective protecting element 120*d* so as to fix the position of the light emitting units 110*c*. The reflective protecting element 120*d* of the present embodiment encapsulates along the adhesive layer 150*c* located on the side surface 116*c* of the light emitting unit 110*c*, and further encapsulates the side surface 173*a* of two sides of the high concentration fluorescent layer 172*a* of the wavelength conversion layer 170*a*. Therefore, the light emitting device 100*k* of the present embodiment not only does not require a conventional carrying support to support and fix the light emitting unit 110*c*, may effectively lower the thickness and manufacturing cost of the package. At the same time, the forward light emitting efficiency of the light emitting unit 110*c* may also be effectively increased through the reflective protecting element 120*d* having high reflectivity. Besides, the low concentration fluorescent layer 174*a* of the wavelength conversion layer 170*a* of the present embodiment encapsulates a top surface 122*d* of the reflective protecting element 120*d*. That is, the side surface 173*a* of the high concentration fluorescent layer 172*a* of the wavelength conversion layer 170*a* is not aligned with the side surface 171*a* of the low concentration fluorescent layer 174*a*.

Figure 16A:
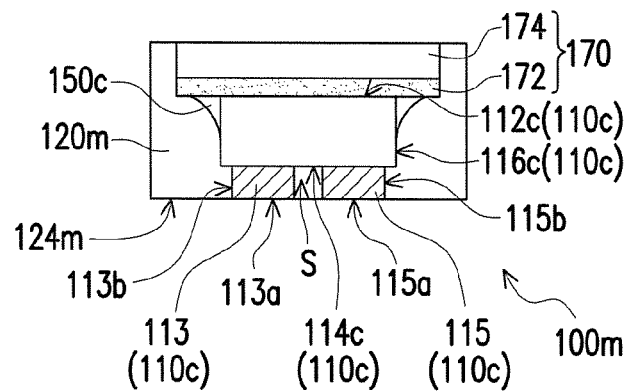
FIG. 16A to FIG. 16C are schematic cross-sectional views illustrating a light emitting device according to a plurality of embodiments of the invention.

In other embodiments, with reference to FIG. 16A, the light emitting device 100*m* of the present embodiment and the light emitting device 100*j* in FIG. 14E are similar. The main difference between the two lies in: the reflective protecting element 120*m* of the present embodiment completely fills in the gap S between the first electrode pad 113 and the second electrode pad 115 and completely encapsulates a first side surface 113*b* of the first electrode pad 113 and a second side surface 115*b* of the second electrode pad 115. Besides, a bottom surface 124*m* of the reflective protecting element 120*m* is aligned with the first bottom surface 113*a* of the first electrode pad 113 and the second bottom surface 115*a* of the second electrode pad 115. In this way, the light leakage in the bottom portion of the light emitting device 100*m* can be avoided. Besides, the reflective protecting element 120*m* completely encapsulates the surface of two sides of the wavelength conversion layer 170*a*. Furthermore, since the reflective protecting element 120*m* has a great encapsulating performance and a preferred structural strength, therefore, the light emitting device 100*m* of the present embodiment not only does not require a conventional carrying support to support and fix the light emitting unit 110*c*, may effectively lower the thickness and manufacturing cost of the package.

Figure 16B:
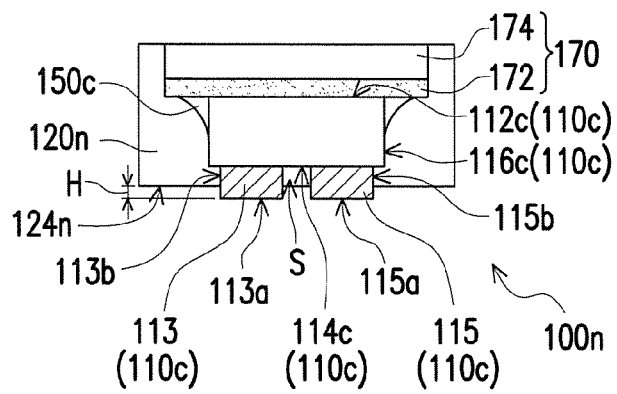
Figure 16C:
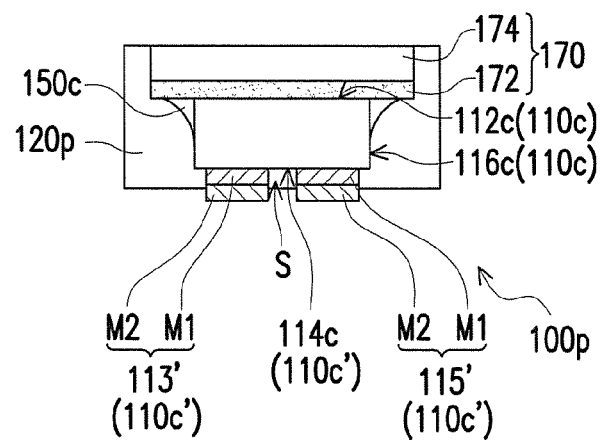

Otherwise, with reference to FIG. 16B, the light emitting device 100*n* of the present embodiment and the light emitting device 100*k* in FIG. 16A are similar. The main difference between the two lies in: the reflective protecting element 120*n* of the present embodiment fills in the gap S between the first electrode pad 113 and the second electrode pad 115 but the reflective protecting element 120*n* does not completely fill therein, and the reflective protecting element 120*n* only encapsulates a portion of the first side surface 113*b* of the first electrode pad 113 and a portion of the second side surface 115*b* of the second electrode pad 115. In other words, a bottom surface 124*n* of the reflective protecting element 120*n* and the first bottom surface 113*a* of the first electrode pad 113 have a height difference H therebetween, and the bottom surface 124*n* of the reflective protecting element 120*n* and the second bottom surface 115*a* of the second electrode pad 115 have the same height difference H therebetween. Besides, with reference to FIG. 16C, the light emitting device 100*p* of the present embodiment and the light emitting device 100*n* in FIG. 16B are similar. The main difference between the two lies in: In particular, the first electrode pad 113' and the second electrode pad 115' of the present embodiment are multilayered metal layer, for example, composed by a first metal layer M1 and a second metal layer M2 but not limited thereto. The reflective protecting element 120*p* completely encapsulates a side surface of the first metal layer M1 of the first electrode pad 113' and the second electrode pad 115', but the reflective protecting element 120*p* does not completely encapsulate a side surface of the second metal layer M2 of the first electrode pad 113' and the second electrode pad 115'. Briefly, the first electrode pad 113 and 113' and the second electrode pad 115 and 115' of the light emitting device 100*m*, 100*n* and 100*p* may be a single layered metal layer or a multilayered metal layer but not limited thereto.

FIG. 17A to FIG. 17E are schematic cross-sectional views illustrating a manufacturing method of a light emitting device according to another embodiment of the invention. In a manufacturing method of a light emitting device of the present embodiment, with reference to FIG. 17A first, a wavelength conversion layer 210 is provided, and the wavelength conversion layer 210 may be a single layer or a multi-layer. In present embodiment, the wavelength conversion layer 210 includes a low concentration fluorescent layer 212 and a high concentration fluorescent layer 214 located on the low concentration fluorescent layer 212. Here, the steps of forming the wavelength conversion layer 210 is, for example, evenly mixing the fluorescent powder (not shown) and the resin (not shown) first. Then, laying the wavelength conversion resin layer on a release film (not shown), and placing the wavelength conversion resin layer for a period of time, for example, 24 hours, after that, the wavelength conversion resin layer 210 having a low concentration fluorescent resin layer 212 and a high concentration fluorescent resin layer 214 separated from each other is formed because of the density difference between the fluorescent powder and the resin. The high concentration fluorescent resin layer 214 will precipitate below the low concentration fluorescent resin layer 212, and the color of the high concentration fluorescent resin layer 214 is, for example, yellow, the low concentration fluorescent resin layer 212 is, for example, having a transparent property. Then wavelength conversion layer 210 of present embodiment is formed after curing. Preferably, a thickness of the low concentration fluorescent resin layer 212 is larger than a thickness of the high concentration fluorescent resin layer 214, and in one embodiment, the thickness ratio may be between 1 to 200 but not limited thereto.

Figure 17A:
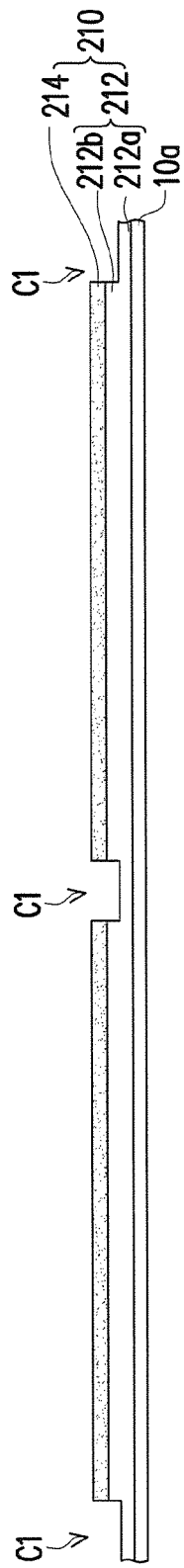

After that, please refer to FIG. 17A first, a double-sided adhesive film 10a is provided, the low concentration fluorescent layer 212 of the wavelength conversion layer 210 is disposed on the double-sided adhesive film 10a so as to fix the position of the wavelength conversion layer 210 through the double-sided adhesive film 10a. Then, a first cutting process is performed from the high concentration fluorescent layer 214 to a portion of the low concentration fluorescent layer 212 so as to form a plurality of trenches C1. After the first cutting process, a patterned wavelength conversion layer 210 is formed. Here, a depth of each trench C1 is at least a half of a thickness of the wavelength conversion resin layer 210. For example, the thickness of the wavelength conversion layer 10 is 240 micrometers, and the depth of the trench C1 is 200 micrometers. At this time, the trench C1 can distinguish the low concentration fluorescent layer 212 of the wavelength conversion layer 210 from a flat portion 212a and a protruding portion 212b located on the flat portion 212a. The high concentration fluorescent layer 212 is located on the protruding portion 212b.

Figure 17B:
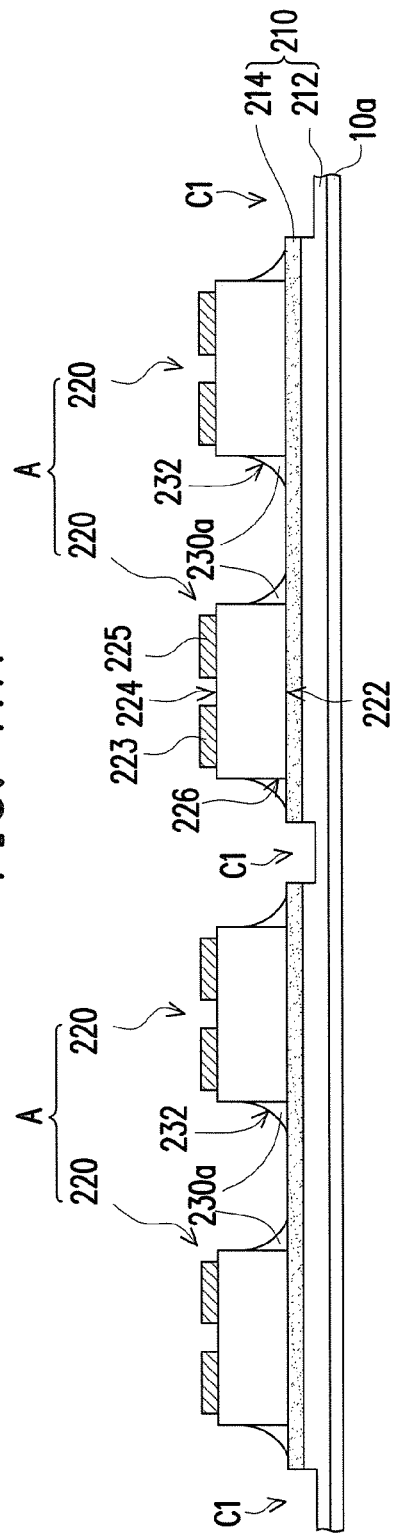

Then, with reference to FIG. 17B, a plurality of light emitting units 220 are disposed on the wavelength conversion layer 210, wherein each light emitting unit 220 has an upper surface 222 and a lower surface 224 opposite to each other, a side surface 226 connecting the upper surface 222 and the lower surface 224, and a first electrode pad 223 and a second electrode pad 225 located on the lower surface 224 and separated from each other. The upper surface 222 of the light emitting unit 220 is located on the high concentration fluorescent layer 214 of the wavelength conversion layer 210 so as to increase the light extraction rate and improve the light pattern. The trenches C1 divides the light emitting units 220 into a plurality of units A, each unit A includes at least two light emitting units 220 in present embodiment (two light emitting units 220 are schematically illustrated in FIG. 17B). Each light emitting unit 220, for example, is an LED with a light emitting wavelength in a range of 315 nanometers to 780 nanometers, and the LED includes but not limited thereto an ultraviolet light LED, a blue light LED, a green light LED, a yellow light LED, an orange light LED or a red light LED.

After that, with reference to FIG. 17B, the adhesive layers 230a is formed on the wavelength conversion layer 210 and extends to be disposed on the side surface 226 of the light emitting units 220. With reference to FIG. 17B, the adhesive layer 230a is gradually thickening from the lower surface 224 of each light emitting unit 220 to the upper surface 222, and the adhesive layer 230a has a concave surface 232 with respect to the side surface 226 of the light emitting 220 but not limited thereto. Here, the purpose of setting the adhesive layers 230a is not only fixing the position of the light emitting units 220 but also improving the light extraction effect of the side surface of the chip since the adhesive layer 230a is a light transmissible material and the index of refraction of the adhesive layer 230a is greater than 1. The adhesive layers 230a may be also formed on the wavelength conversion layer 210 before disposing the light emitting units 220 on the wavelength conversion layer 210.

Figure 17C:
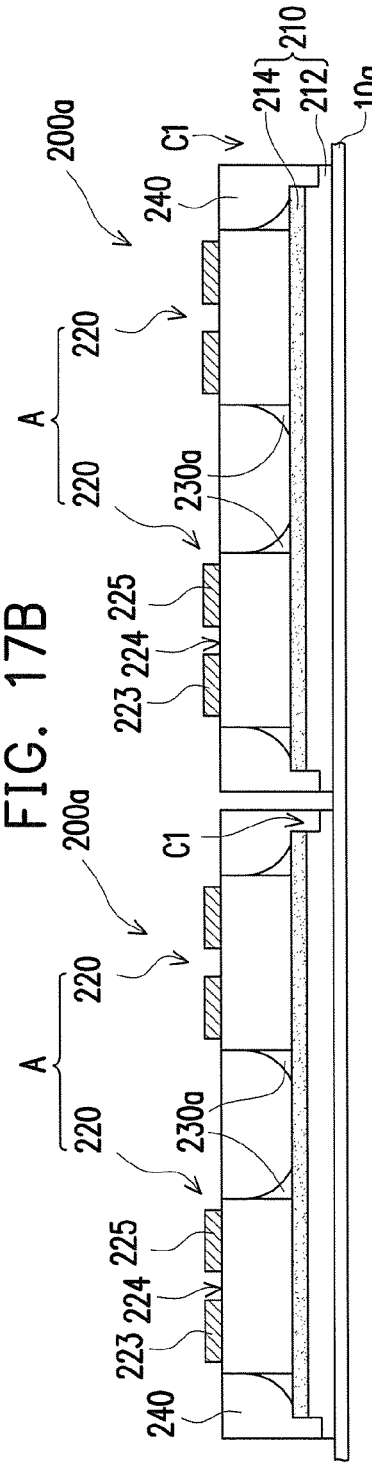

Then, with reference to FIG. 17C, a reflective protecting element 240 is formed between the light emitting units 220, and the reflective protecting element 240 fills in the trenches C1, wherein the reflective protecting element 240 is formed on the wavelength conversion layer 210 and encapsulates each unit A, and the reflective protecting element 240 fills in the trenches C1. The reflective protecting element 240 exposes the lower surface 224, the first electrode pad 223 and the second electrode pad 225 of each light emitting unit 220. Here, the reflectivity of the reflective protecting element 240 is at least greater than 90%, and the reflective protecting element 240 is, for example, a white resin layer. The way of forming the reflective protecting element 240 is, for example, performing by dripping, wherein the reflective protecting element 240 directly encapsulates adhesive layer 230a and extends to encapsulate the side surface of the high concentration fluorescent resin layer 214 along the adhesive layer 230a, and the reflective protecting element 240 fills in the trenches C1. At this time, the reflective protecting element 240 is not over the first electrode pad 223 and the second electrode pad 225 of the light emitting unit 220.

After that, with reference to FIG. 17C, a second cutting process is performed from the reflective protecting element 240 and along the trench C1, and the low concentration fluorescent layer 212 is penetrated so that a plurality of light emitt g device 200a separated from each other is formed. At this time, with reference to FIG. 17C, the wavelength conversion layer 210 in contacted with two light emitting units 220 in each unit A is continuous, i.e. the light emitting units 220 have the same light emitting surface, therefore the light emitted from the light emitting units 220 can be guided through the transparent low concentration fluorescent layer 212, so that the light emitting device 200a has preferred luminous uniformity.

Then, with reference to both FIG. 17C and FIG. 17D, a reverse process is performed after performing the second cutting process. An ultraviolet adhesive film 20a on the first electrode pads 223 and the second electrode pads 225 of the light emitting units 220 is provided first so as to fix the relative position of the light emitting devices 200a. Then, the double-sided adhesive film 10a is removed and the low concentration fluorescent layer 212 of the wavelength conversion resin layer 210 is exposed. Finally, with reference to FIG. 17E, the ultraviolet adhesive film 20a is removed so that the first electrode pads 223 and the second electrode pads 225 of the light emitting units 220 are exposed. So far, the light emitting device 200a is completely manufactured. It should be noted that in order to facilitate explanation, only one light emitting device 200a is schematically illustrated in FIG. 17E.

With reference to FIG. 17E, on the structure, the light emitting device 200a includes a plurality of light emitting units 220 (two light emitting units 220 are schematically illustrated in FIG. 17E), a wavelength conversion layer 210 and a reflective protecting element 240. Each light emitting unit 220 has an upper surface 222 and a lower surface 224 opposite to each other, a side surface 226 connecting the upper surface 222 and the lower surface 224, and a first electrode pad 223 and a second electrode pad 225 separated from each other which are located on the lower surface 224 and. The wavelength conversion layer 210 is disposed on the upper surface 222 of the light emitting unit 220, and the wavelength conversion layer 210 includes a low concentration fluorescent layer 212 and a high concentration fluorescent layer 214. The low concentration fluorescent layer 212 has a flat portion 212a and a protruding portion 212b located on the flat portion 212a. The high concentration fluorescent layer 214 is disposed between the upper surface 222 and the protruding portion 212b, wherein the high concentration fluorescent layer 214 encapsulates the protruding portion 212b and touches the upper surface 222 of light emitting unit

200. The light emitting units 220 are arranged at intervals and expose a portion of the wavelength conversion layer 210. The reflective protecting element 240 encapsulates the side surface 226 of each light emitting unit 220 and encapsulates the wavelength conversion resin layer 210 exposed by the light emitting unit 220. The reflective protecting element 240 exposes the lower surface 224, the first electrode pad 223 and the second electrode pad 225 of each light emitting unit 220. The side surface of the reflective protecting element 240 is aligned with the side surface of the flat portion 212*a* of the low concentration fluorescent layer 212.

The light emitting units 220 of the light emitting device 200*a* of the present embodiment only touch one wavelength conversion layer 210, that is, the light emitting units 220 have the same light emitting surface, and a side surface of the low concentration fluorescent layer 212 is aligned with a side surface of the reflective protecting element 240. Therefore, the light emitted from the light emitting units 220 can be guided through the low concentration fluorescent layer 212, so that the light emitting device 200*a* of the present embodiment may have larger light emitting area and preferred luminous uniformity. Besides, the reflective protecting element 240 encapsulates the side surface 226 of the light emitting unit 220, and the reflective protecting element 240 exposes the first electrode pad 223 and the second electrode pad 225 of the light emitting unit 220. Therefore, the light emitting device 200*a* of the present invention does not require a conventional carrying support to support and fix the light emitting unit 220, and may effectively lower the thickness and manufacturing cost of the package. At the same time, the forward light emitting efficiency of the light emitting unit 220 can also be effectively increased.

It should be mentioned that the structural configuration of the adhesive layer 230*a* of the present embodiment is not limited even though the adhesive layer 230*a* illustrated in FIG. 17E has a concave surface 232 with respect to the side surface 226 of the light emitting 220 in particular. In other words, the reflective protecting element 240 further includes a reflective surface 242 in contact with the light emitting unit 220, and the reflective surface 242 is a curved surface in particular. However, in other embodiments, with reference to FIG. 18A, the light emitting device 200*b* of the present embodiment and the light emitting device 200*a* in FIG. 17E are similar. The main difference between the two lies in: the adhesive layer 230*b* has a convex surface 234 with respect to the side surface 226 of each light emitting unit 220, therefore edge light emitted from the light emitting unit 220 occurring may be increased, and the light emitting area of the light emitting device 200*b* may be also increased with the configuration of the wavelength conversion layer 210. In other words, the reflective surface 242*a* of the reflective protecting element 240*a* is a curved surface in particular. Otherwise, with reference to FIG. 18B, a light emitting device 200*c* of the present embodiment and the light emitting device 200*a* of FIG. 17E are similar. The main difference between the two lies in: the adhesive layer 230*c* has an inclined surface 236 with respect to the side surface 226 of each light emitting unit 220. In other words, the reflective surface 242*b* of the reflective protecting element 240*b* is a flat surface in particular.

It should be noted here, the below embodiments utilize the same label and partial contents of the above embodiment, wherein the same labels are adopted to represent same or similar elements and the description of similar technical content is omitted.

Figure 19A:
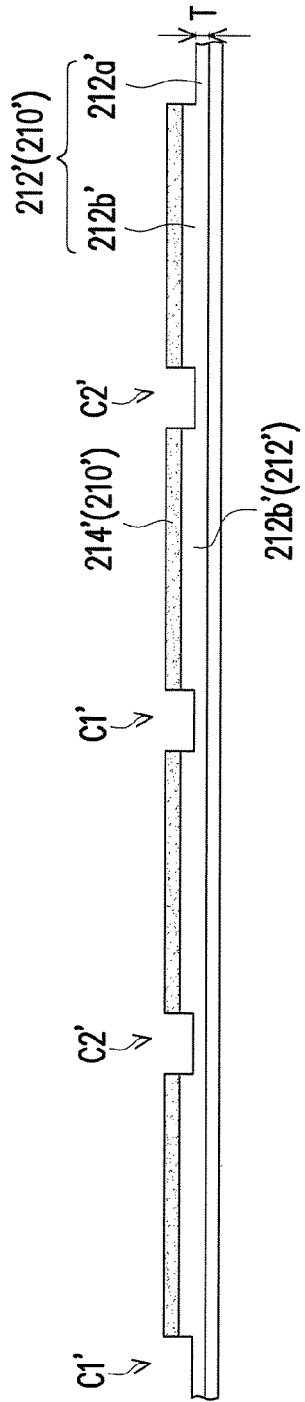
FIG. 19A to FIG. 19E are schematic cross-sectional views illustrating a manufacturing method of a light emitting device according to another embodiment of the invention.

FIG. 19A to FIG. 19E are schematic cross-sectional views illustrating a manufacturing method of a light emitting device according to another embodiment of the invention. The manufacturing method of the light emitting device 200*d* of the present embodiment is similar to the manufacturing method of the light emitting device 200*a* of FIG. 17A to FIG. 17E, and a main difference is that: with reference to FIG. 19A, a plurality of second trenches C2' cut from the high concentration fluorescent layer 214' to a portion of the low concentration fluorescent layer 212' are further formed in performing the first cutting process. With reference to FIG. 19A, the position of the trenches C1' and the position of the trenches C2' are staggered arranged, wherein a depth of each trench C1' is at least a half of a thickness of the wavelength conversion layer 210', and a depth of each second trench C2' is the same as the depth of each first trench C1'. For example, the thickness of the wavelength conversion layer 210' is 240 micrometers, and the depth of the trench C1' and the depth of the second trench C2' are 200 micrometers but not limited thereto. At this time, the flat portion 212*a*' of the low concentration fluorescent layer 212' has a thickness T, preferably, the thickness T is, for example, between 20 micrometers to 50 micrometers. At this time, the second trench C2' can divide the protruding portion of the low concentration fluorescent layer 212' of the wavelength conversion layer 210' into two sub protruding portions 212*b*', and the high concentration fluorescent layer 214' is located on the sub protruding portions 212*b*'.

Figure 19B:
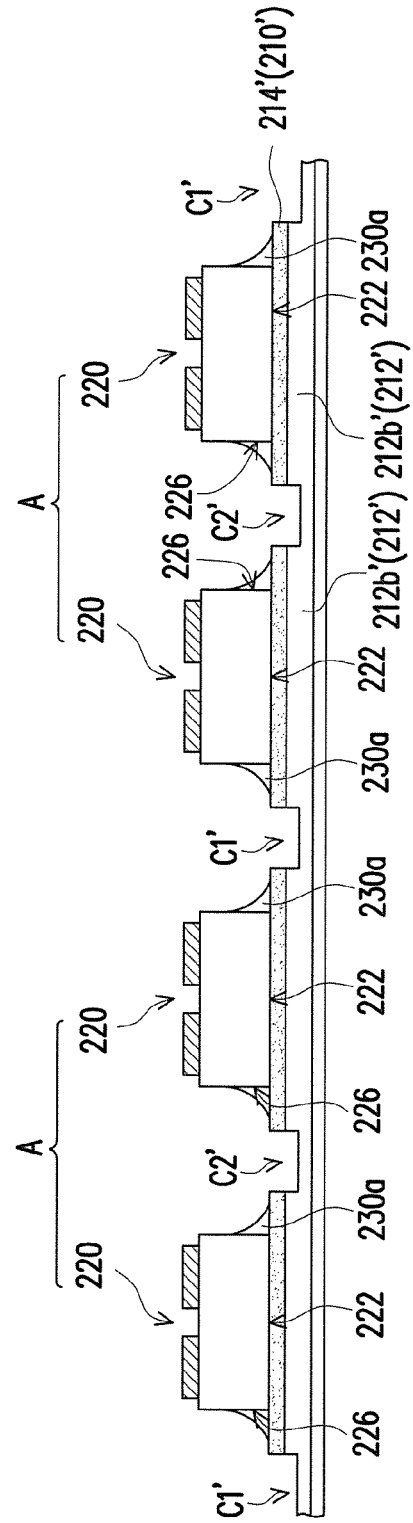

Then, with reference to FIG. 19B, the light emitting units 220 arranged at intervals are disposed on the wavelength conversion layer 210', wherein the second trench C2' is located between two light emitting units 220 of each unit A, the light emitting units 220 are disposed on the sub protruding portions 212*b*' respectively, and the upper surface 222 of the light emitting unit 220 directly touches the high concentration fluorescent layer 214'. Preferably, the ratio of the length of each sub protruding portion 212*b*' and the length of the corresponding light emitting unit 220 is larger than 1 and less than 1.35, that is, a side surface of the sub protruding portion 212*b*' of the low concentration fluorescent layer 212' is outside the side surface of the light emitting unit 220, and a side surface of the high concentration fluorescent layer 214' also extends outside the side surface of the light emitting unit 220 so that the light emitting area of the light emitting unit 220 may be effectively increased. After that, an adhesive layer 230*a* on the side surface 226 of the light emitting unit 220 is formed, wherein the adhesive layer 230*a* is merely disposed on the side surface 226 of the light emitting unit 220 and extends on the high concentration fluorescent layer 214' of the wavelength conversion layer 210', the adhesive layer 230*a* does not extend to be disposed on the low concentration fluorescent layer 212'.

Figure 19C:
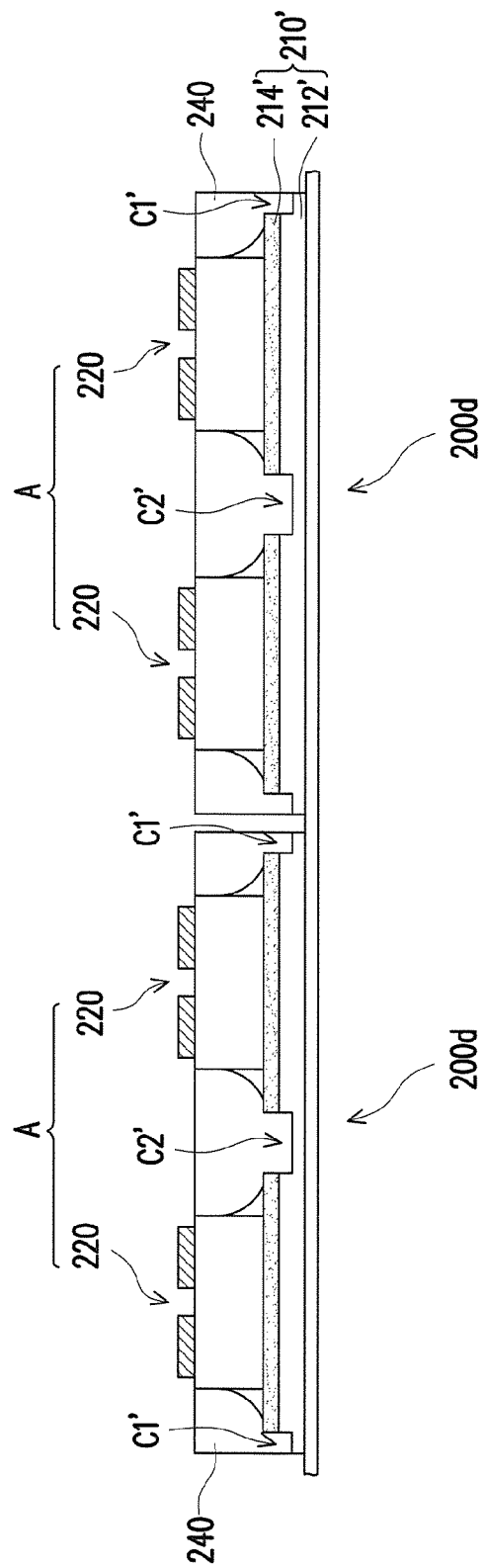
Figure 19D:
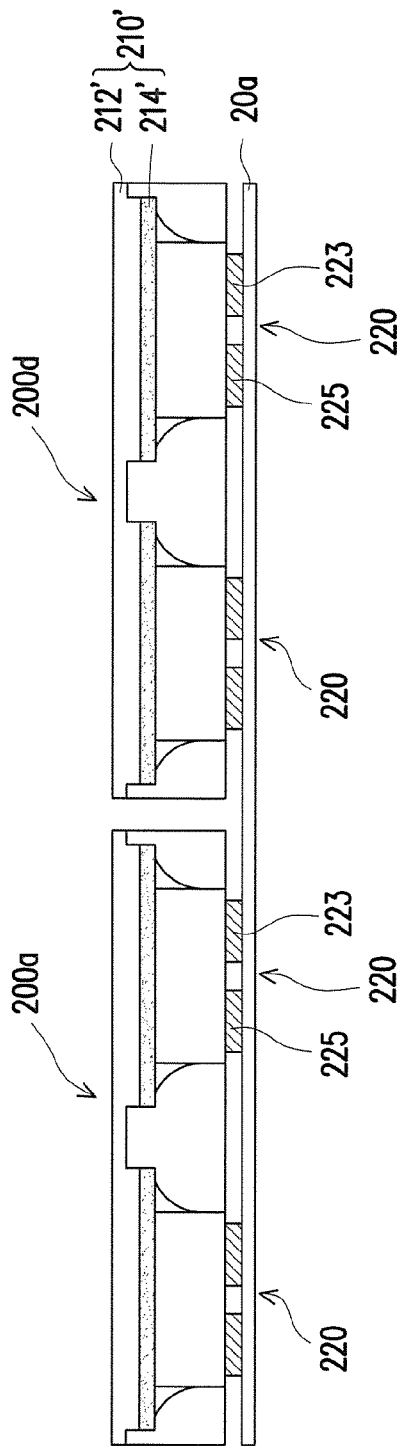

Then, the same as the abovementioned steps in FIG. 17C, FIG. 17D and FIG. 17E, with reference to FIG. 19C, the reflective protecting element 240 on the wavelength conversion layer 210' is formed, and the reflective protecting element 240 encapsulates each unit A and fills in the trenches C1' and the trenches C2'. After that, a second cutting process is performed from the reflective protecting element 240 and along the trench C1', and the low concentration fluorescent layer 212' is penetrated so that a plurality of light emitting devices 200*d* separated from each other are formed. Then, with reference to both FIG. 19C and FIG. 19D, a reverse process is performed after performing the second cutting process. An ultraviolet adhesive film 20*a* on the first electrode pads 223 and the second electrode pads 225 of the light emitting units 220 is provided first so as to fix the relative position of the light emitting devices 200*a*. Then, the double-sided adhesive film 10a is removed and the low concentration fluorescent layer 212' of the wavelength conversion layer 210' is exposed. Finally, with reference to FIG. 19E, the ultraviolet adhesive film 20a is removed so that the first electrode pads 223 and the second electrode pads 225 of the light emitting units 220 are exposed. So far, the light emitting device 200d is completely manufactured. It should be noted that in order to facilitate explanation, only one light emitting device 200d is schematically illustrated in FIG. 19E.

Figure 19E:
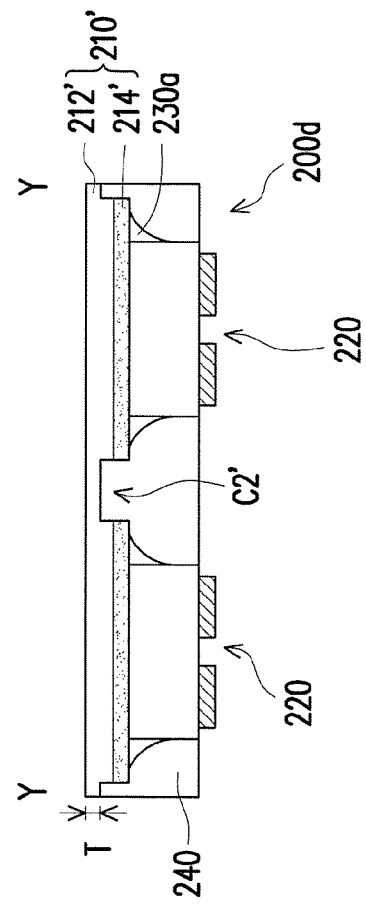
Figure 20A:
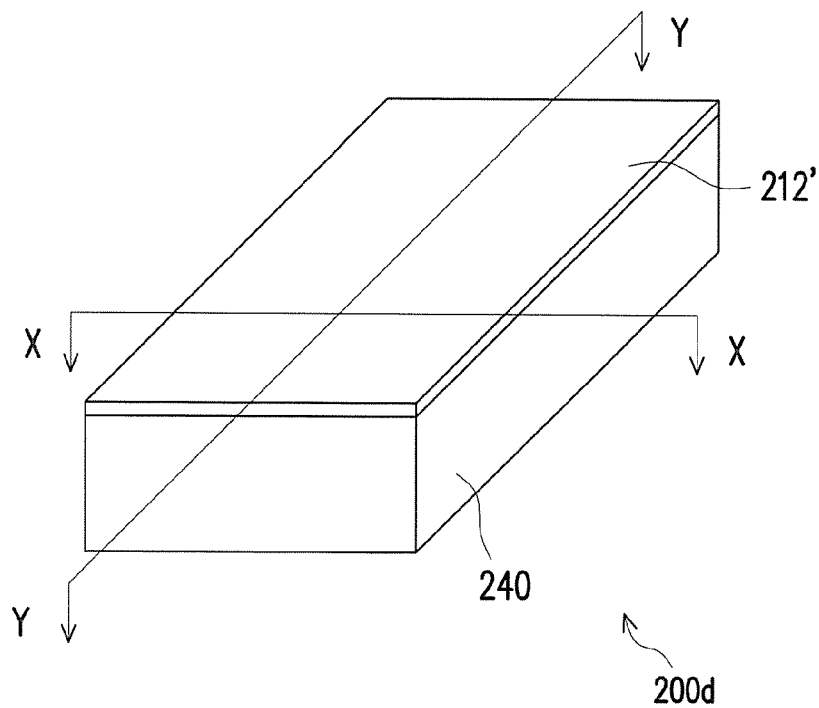
FIG. 20A is schematic stereoscopic view illustrating the light emitting device in FIG. 19E.
Figure 20B:
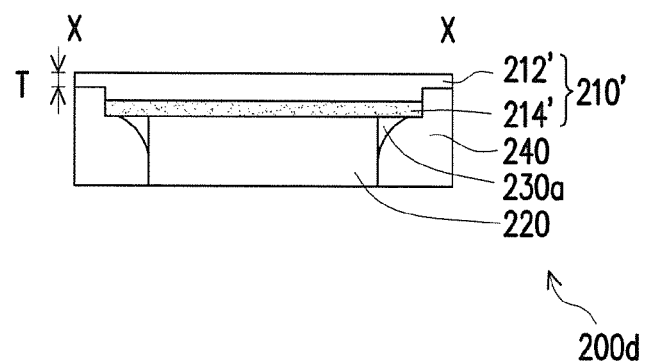
FIG. 20B is a schematic sectional view along the line X-X of FIG. 20A.

Please refer to both FIG. 19E, FIGS. 20A and 20B, it should be noted that FIG. 19E is a schematic cross-sectional view along line Y-Y of FIG. 20A. The light emitting device 200d of the present embodiment is similar to the light emitting device 200a of FIG. 17E, and a main difference is that: the wavelength conversion layer 210' exposed by two light emitting units 220 further has the second trenches C2', wherein the second trench C2' extends from the high concentration fluorescent layer 214' to a portion of the low concentration fluorescent layer 212'. That is, two light emitting units 220 are disposed on a continuous wavelength conversion layer 210', therefore, the light emitting units 220 have the same light emitting surface, and the side surface of the low concentration fluorescent layer 212' is aligned with the side surface of the reflective protecting element 240. Therefore, the light emitted from the light emitting unit 220 can be guided through the low concentration fluorescent layer 212', so that the light emitting device 200d of the present embodiment may have larger light emitting area and preferred luminous uniformity.

Especially, in the first cutting process, the cutting depth in the direction of line X-X in FIG. 20A is substantially the same as the cutting depth in the direction of line Y-Y in FIG. 20A. That is, with reference to the cross-sectional view along line X-X in FIG. 20B, the flat portion 212a' of the low concentration fluorescent layer 212' has a thickness T. With reference to the cross-sectional view along line Y-Y in FIG. 19E, the flat portion 212a' of the low concentration fluorescent layer 212' also has the same thickness T. Preferably, the thickness T is, for example, between 20 micrometers to 50 micrometers.

Figure 21A:
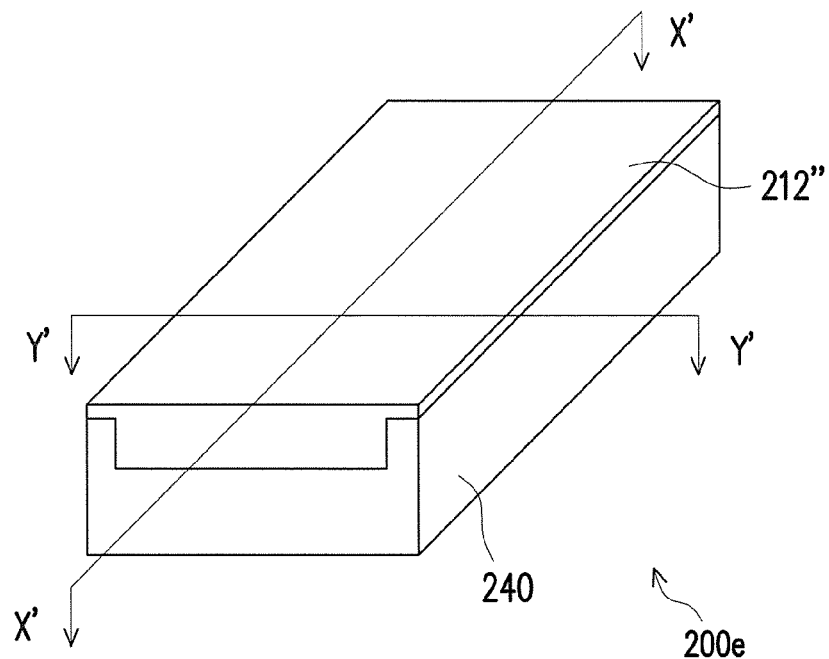
FIG. 21A is schematic stereoscopic view illustrating a light emitting device according to another embodiment of the invention.
Figure 21B:
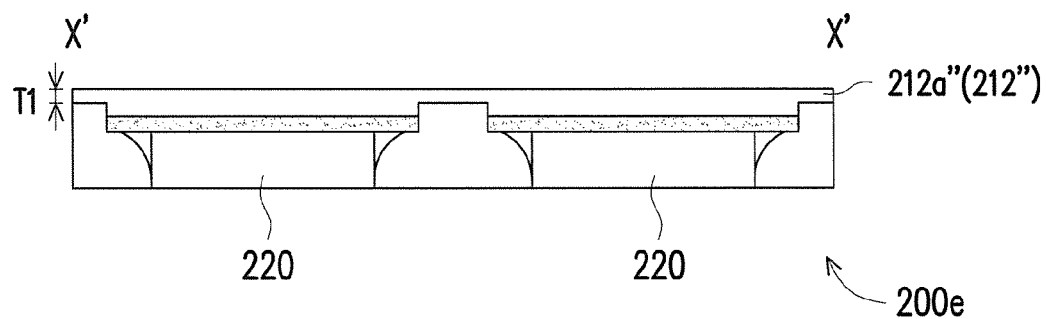
FIG. 21B and FIG. 21C are schematic sectional views along the line X'-X' and the Y'-Y' of FIG. 21A respectively.
Figure 21C:
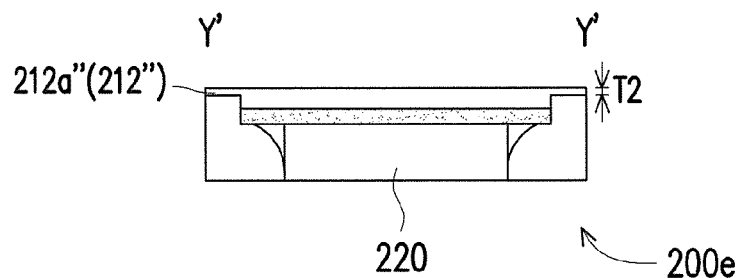

Certainly, in other embodiments, the flat portion 212a' of the low concentration fluorescent layer 212' may also have different thicknesses when cutting from different directions in the first cutting process. FIG. 21A is schematic stereoscopic view illustrating a light emitting device according to another embodiment of the invention. FIG. 21B and FIG. 21C are schematic sectional views along the line X'-X' and the Y'-Y' of FIG. 21A respectively. With reference to both FIG. 21A, FIG. 21B and FIG. 21C, the cutting depth along the direction of line X'-X' in FIG. 21A is different from the cutting depth along the direction of line Y'-Y' in FIG. 21A in the first cutting process, so that the wavelength conversion layer 210' further includes a first exposed side portion and a second exposed side portion which are not encapsulated by the reflective protecting element 240. The first exposed side portion is not parallel to the second exposed side portion, and the thickness of the wavelength conversion resin layer 210' at the first exposed side portion is different from the thickness of the wavelength conversion resin layer 210' at the second exposed side portion. In detail, the flat portion 212a" of the low concentration fluorescent layer 212" has a first thickness T1 in the direction of line X'-X', and the flat portion 212a" of the low concentration fluorescent layer 212" has a second thickness T2 in the direction of line Y'-Y'. The first thickness T1 is different from the second thickness T2. Preferably, the first thickness T1 is, for example, between 50 micrometers to 200 micrometers, and the second thickness T2 is, for example, between 20 micrometers to 50 micrometers.

Since the flat portion 212a" of the low concentration fluorescent layer 212" has the first thickness T1 and the second thickness T2 different from the first thickness T1 in the direction of line X'-X' and the direction of line Y'-Y' respectively, the brightness decrease caused by dark band between adjacent two light emitting units 220 may be effectively reduced so as to improve the luminous uniformity of the light emitting device 200e. Otherwise, it is worth mentioning that, taking the direction of line X'-X' for example, when the thickness T1 of the flat portion 212a" of the low concentration fluorescent layer 212" is increased from 0.04 millimeters to 0.2 millimeters, the light emitting angle may also be increased from 120 degrees to 130 degrees, i.e. the light emitting angle may be increased by 10 degrees. Briefly, the thickness of the flat portion 212a" of the low concentration fluorescent layer 212" and the light emitting angle of the light emitting unit 220 have a positive correlation.

In summary, the reflective protecting element of the invention encapsulates the side surface of the light emitting device, and the bottom surface of the reflective protecting element exposes the first bottom surface of the first electrode pad and the second bottom surface of the second electrode pad of the light emitting unit, therefore the light emitting device of the invention does not require a conventional carrying support to support and fix the light emitting unit, and may effectively lower the thickness and manufacturing cost of the package. At the same time, the forward light emitting efficiency of the light emitting unit can also be effectively increased.

Besides, the light emitting units of the light emitting device in the invention only contact with one wavelength conversion layer, that is, the light emitting units have the same light emitting surface, and the side surface of the low concentration fluorescent layer is aligned with the side surface of the reflective protecting element, therefore, the light emitted from the light emitting unit can be guided through the low concentration fluorescent layer, so that the light emitting device in the invention may have larger light emitting angle and preferred luminous uniformity. Besides, the reflective protecting element encapsulates the side surface of the light emitting unit, and the reflective protecting element exposes the first electrode pad and the second electrode pad of the light emitting unit. Therefore, the light emitting device of the invention does not require a conventional carrying support to support and fix the light emitting unit, and may effectively lower the thickness and manufacturing cost of the package. At the same time, the forward light emitting efficiency of the light emitting unit can also be effectively increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
   at least one light emitting unit, having electrodes disposed thereon;
   a wavelength conversion layer, comprising a high concentration fluorescent layer and a low concentration fluorescent layer;

an adhesive layer, adhering the wavelength conversion layer to an upper surface of the light emitting unit opposite to the electrodes and encapsulating a portion of a lateral surface of the light emitting unit, wherein the high concentration fluorescent layer faces to the upper surface of the light emitting unit; and a reflective layer, covering the light emitting unit, the adhesive layer and the wavelength conversion layer to expose an upper surface of the wavelength conversion layer and the electrodes, wherein a reflective surface of the reflective layer is inclined to the lateral surface of the light emitting unit and reflects a light emitted from the light emitting unit back into the high concentration fluorescent layer, wherein a lower surface of the reflective layer is higher than lower surfaces of the electrodes, wherein the light emitting device has a flat lateral surface comprising the reflective layer, and the adhesive layer further comprises a portion disposed directly between the high concentration fluorescent layer and the light emitting unit.

2. The light emitting device as claimed in claim 1, wherein the reflective surface of the reflective layer comprises a convex surface or a concave surface.

3. The light emitting device as claimed in claim 1, wherein the light emitting unit has a light emitting body on which the electrodes are disposed, and the lower surface of the reflective layer is not lower than a bottom surface of the light emitting body.

4. The light emitting device as claimed in claim 3, wherein the lower surface of the reflective layer is inclined to the lateral surface of the light emitting unit and recessed upwardly.

5. The light emitting device as claimed in claim 1, wherein the lower surface of the reflective layer is inclined to the lateral surface of the light emitting unit and recessed upwardly.

6. The light emitting device as claimed in claim 1, wherein the flat lateral surface of the light emitting device further comprises a portion of the low concentration fluorescent layer disposed on the reflective layer.

7. The light emitting device as claimed in claim 1, wherein the light emitting device has an upper surface comprising the low concentration fluorescent layer.

8. The light emitting device as claimed in claim 7, wherein the upper surface of the light emitting device further comprises a portion of the reflective layer surrounding the low concentration fluorescent layer.

9. A light emitting device, comprising:
at least one light emitting unit, having electrodes disposed thereon;
a wavelength conversion layer;
an adhesive layer, adhering the wavelength conversion layer to an upper surface of the light emitting unit opposite to the electrodes and encapsulating a portion of a lateral surface of the light emitting unit; and
a reflective layer, covering the light emitting unit, the adhesive layer and the wavelength conversion layer to expose an upper surface of the wavelength conversion layer and the electrodes, wherein a reflective surface of the reflective layer is inclined to the lateral surface of the light emitting unit and reflects a light emitted from the light emitting unit back into the wavelength conversion layer, wherein a lower surface of the reflective layer is higher than lower surfaces of the electrodes,
wherein the light emitting device has a flat lateral surface comprising the reflective layer, and has an upper surface comprising the wavelength conversion layer and the reflective layer surrounding the wavelength conversion layer.

10. The light emitting device as claimed in claim 9, wherein the wavelength conversion layer comprises a high concentration fluorescent layer and a low concentration fluorescent layer, wherein the high concentration fluorescent layer faces to the light emitting unit.

11. The light emitting device as claimed in claim 9, wherein the reflective surface of the reflective layer comprises a convex surface or a concave surface.

12. The light emitting device as claimed in claim 9, wherein the light emitting unit has a light emitting body on which the electrodes are disposed, and the lower surface of the reflective layer is not lower than a bottom surface of the light emitting body.

13. The light emitting device as claimed in claim 12, wherein
the lower surface of the reflective layer is inclined to the lateral surface of the light emitting body and recessed upwardly.

14. The light emitting device as claimed in claim 9, wherein the lower surface of the reflective layer is inclined to the lateral surface of the light emitting unit and recessed upwardly.

* * * * *